US005991897A

United States Patent [19]

Perugini et al.

[11] Patent Number: 5,991,897
[45] Date of Patent: Nov. 23, 1999

[54] DIAGNOSTIC MODULE DISPATCHER

[75] Inventors: Robert Perugini, Tomball; John Scott Harsany, Houston; Robert E. Supak, Cypress, all of Tex.

[73] Assignee: Compaq Computer Corporation, Houston, Tex.

[21] Appl. No.: 09/223,537

[22] Filed: Dec. 30, 1998

Related U.S. Application Data

[63] Continuation of application No. 08/777,902, Dec. 31, 1996.

[51] Int. Cl.[6] .................................................. G06F 11/273
[52] U.S. Cl. ............................ 714/27; 714/32; 714/44; 714/46
[58] Field of Search ............................... 714/25, 46, 31, 714/55, 44, 32, 27

[56] References Cited

U.S. PATENT DOCUMENTS

| | | | |
|---|---|---|---|
| 4,057,847 | 11/1977 | Lowell et al. | 364/200 |
| 4,488,299 | 12/1984 | Fellhauer et al. | 371/20 |
| 4,718,064 | 1/1988 | Edwards et al. | 371/20 |
| 4,823,343 | 4/1989 | Takahashi | 371/16 |
| 4,837,764 | 6/1989 | Russello | 371/20 |
| 5,021,997 | 6/1991 | Archie et al. | 364/900 |
| 5,050,088 | 9/1991 | Buckler et al. | 364/468 |
| 5,124,622 | 6/1992 | Kawamura et al. | 318/569 |
| 5,157,782 | 10/1992 | Tuttle et al. | 395/575 |
| 5,233,611 | 8/1993 | Triantafyllos et al. | 371/16.1 |
| 5,367,667 | 11/1994 | Wahlquist et al. | 395/575 |
| 5,371,883 | 12/1994 | Gross et al. | 395/575 |
| 5,388,252 | 2/1995 | Dreste et al. | 395/575 |
| 5,390,324 | 2/1995 | Burkhartt et al. | 395/575 |
| 5,455,933 | 10/1995 | Schieve et al. | 395/183.03 |
| 5,513,319 | 4/1996 | Finch et al. | 395/185.08 |
| 5,602,990 | 2/1997 | Leete | 395/183.22 |
| 5,629,878 | 5/1997 | Kobrosly | 364/579 |
| 5,724,273 | 3/1998 | Desgrousilliers et al. | 364/580 |

Primary Examiner—Robert W. Beausoliel, Jr.
Assistant Examiner—Scott T. Baderman
Attorney, Agent, or Firm—Akin, Gump, Strauss, Hauer & Feld, LLP

[57] ABSTRACT

In a diagnostic application, a plurality of independent test modules are executed in a multi-tasking fashion. The diagnostic application is modular with a front end module issuing commands to lower level modules. A lower level test dispatcher module receives information from the plurality of test modules pertaining to test parameters, including whether the test module is multitaskable. A test dispatcher controls the launching of the test modules according to the test parameters. A test definition tool is provided to graphically develop test scripts by moving icons from one list to another. The output of the test definition tool is a scripting language readable by the diagnostic application.

20 Claims, 18 Drawing Sheets

FIG. 4D

Test List

Device: CDROM        Device Number: 1

Tests | Threaded | Parameters | Parameter Values
--- | --- | --- | ---
☑ Sequential Seek Task | ☑ | Start Sec: | 300
 | | End Sec: | 500
 | | Increment | 10
☑ Random Seek Task | ☑ | Start Sec: | 300
 | | End Sec: | 500
 | | %Coverage | 20
☑ Converging Seek Task | ☑ | %Coverage | 20
 | | Increment | 10

All Tests | No Tests | Invert Tests | OK | Cancel

DIAGNOSTIC MODULE DISPATCHER

SPECIFICATION

This application is a continuation of U.S. application Ser. No. 08/777,902 filed Dec. 31, 1996.

BACKGROUND OF THE INVENTION

1. Field of the Invention

The invention relates to a diagnostic testing tool for testing personal computers and the like and more specifically to a multi-tasking, object oriented testing system wherein a plurality of modules are independently executable.

2. Description of the Related Art

There are a wide variety of diagnostic tools available for testing personal computers. Some of these utilities, such as Norton Disk Doctor from Symantec Corporation, focus on a particularly troublesome device, like a hard disk drive and its associated control electronics. While these tools may serve a useful purpose for a specific problem, they are not intended to diagnose an entire computer. Others utilities, such as Microsoft Diagnostics are intended to provide general inspect information for an entire computer system. The operator can check the status of a variety of hardware and software items installed in the computer system through a graphical display. However, these tools like Microsoft Diagnostics are not intended nor are they easily adaptable for a large production line. Output is limited to what can be viewed on the screen. The user must operate the software.

One known factory tool is Compaq Diagnostics for DOS (disk operating system). This tool provides a suite of tests which can be run on the personal computer to test a variety of devices, such as memory, hard disks, floppy disks and serial ports. A specific module is provided to test each device. Once a device is tested, a subsequent test may be performed on a next device The tests are performed sequentially until all the desired devices have been tested. Thus, to test an entire computer system can take a rather long time. A faster method of testing computers is desired.

This Compaq diagnostics tool functions well, however, DOS is no longer the operating system of choice. Today operating systems, such as Windows and OS/2 have graphical user interfaces. Certain operating systems, such as Windows NT, do not allow a DOS application to communicate directly with hardware, thereby further complicating diagnostic routines. Furthermore, devices operating under these operating systems often involve complicated set-ups. It is possible for a configuration problem to make a device appear as though it was defective. Thus, testing devices solely under DOS is not acceptable anymore.

A scripting language is provided by the Compaq Diagnostics for DOS tool to allow a factory project manager to write test sequences. However, many deficiencies are known to exist. The scripting language requires some training before the project manager is proficient. If the project manager does not understand English, the scripts must be translated to her foreign language. As with all programming languages, the code must be debugged. Thus, an easier, simpler method of developing test routines is desired.

SUMMARY OF THE INVENTION

The present invention disclosed and claimed herein comprises a diagnostic application for operation on a computer system. The diagnostic application is operable on a number of operating systems, such as Windows 95, Windows NT and OS/2. These operating systems are distinguishable by their multitasking capabilities.

The diagnostic application is comprised of a front end module and several tiers of lower level modules. The front end module is responsible for interacting with a user and communicating with the lower level modules to initiate processes. At the lowest level are a plurality of diagnostic library modules (DLs) which function to interact with the hardware and software to provide identification and diagnostic information back to the front end. Generally, the DLs are created for specific types of devices, such as floppy disk drives. As hardware devices change or new hardware is developed, the existing DLs can be modified or new DLs can be provided by the hardware manufacturer to work in conjunction with the diagnostic application.

Between the DLs and the front end is a test dispatcher which functions to control the dispatching of tests according to several parameters reported by the DLs, including whether the test is multitaskable. These parameters are generally modifiable by the user with the front end.

The front end issues commands to the DLs to load and initialize. In response, the DLs provide device, test and parameter information to a test engine. The test engine is a repository of the information gathered by the DLs. When the user starts the testing, the information is copied from the test engine to the test dispatcher so that the test dispatcher can subsequently determine which tests should be run and in what order.

When the testing begins, the DLs are checked for lack of progress. A heartbeat counter periodically provides a count to the DLs and the test dispatcher. Each DL registers the count in a private memory area. The test dispatcher also registers the count so that comparisons can be made to determine if a particular DL is still progressing or operating.

The diagnostic application is also operable in a factory environment where the computer system is tested at several stations along a manufacturing line. A test definition tool is provided. to develop tests without using programming or scripts. The tool presents a graphical test development environment which allows test personnel to easily create tests with a bill of materials. To create a set of tests, the personnel simply drag a device test from an available list to a station profile list. Tests can be enabled/disabled and parameters can be modified. When a file is saved in the test definition tool, a test definition file is compiled and saved. The test definition file is directly readable by the diagnostic application.

BRIEF DESCRIPTION OF THE DRAWINGS

A better understanding of the present invention can be obtained when the following detailed description of the preferred embodiment is considered in conjunction with the following drawings, in which:

FIGS. 4C–D are screen snapshots illustrating configuration selections for a test definition file according to the preferred embodiment;

DETAILED DESCRIPTION OF THE PREFERRED EMBODIMENT

The following disclosures are hereby incorporated by reference:

U.S. application Ser. No. 08/774,808, entitled "Multi-Taskable Diagnostic Modules," by John Scott Harsany, Robert Perugini and Robert E. Supak, filed Dec. 31, 1996;

U.S. application Ser. No. 08/775,778, entitled "Test Definition Tool," by A. Lee Jenkins, John Scott Harsany and Robert Perugini, filed Dec. 31, 1996

U.S. application Ser. No. 08/777,663, entitled "Driver Level Diagnostics," by Thanh V. Hoang and Paul Fontenot, filed Dec. 31, 1996.

Figure 1:
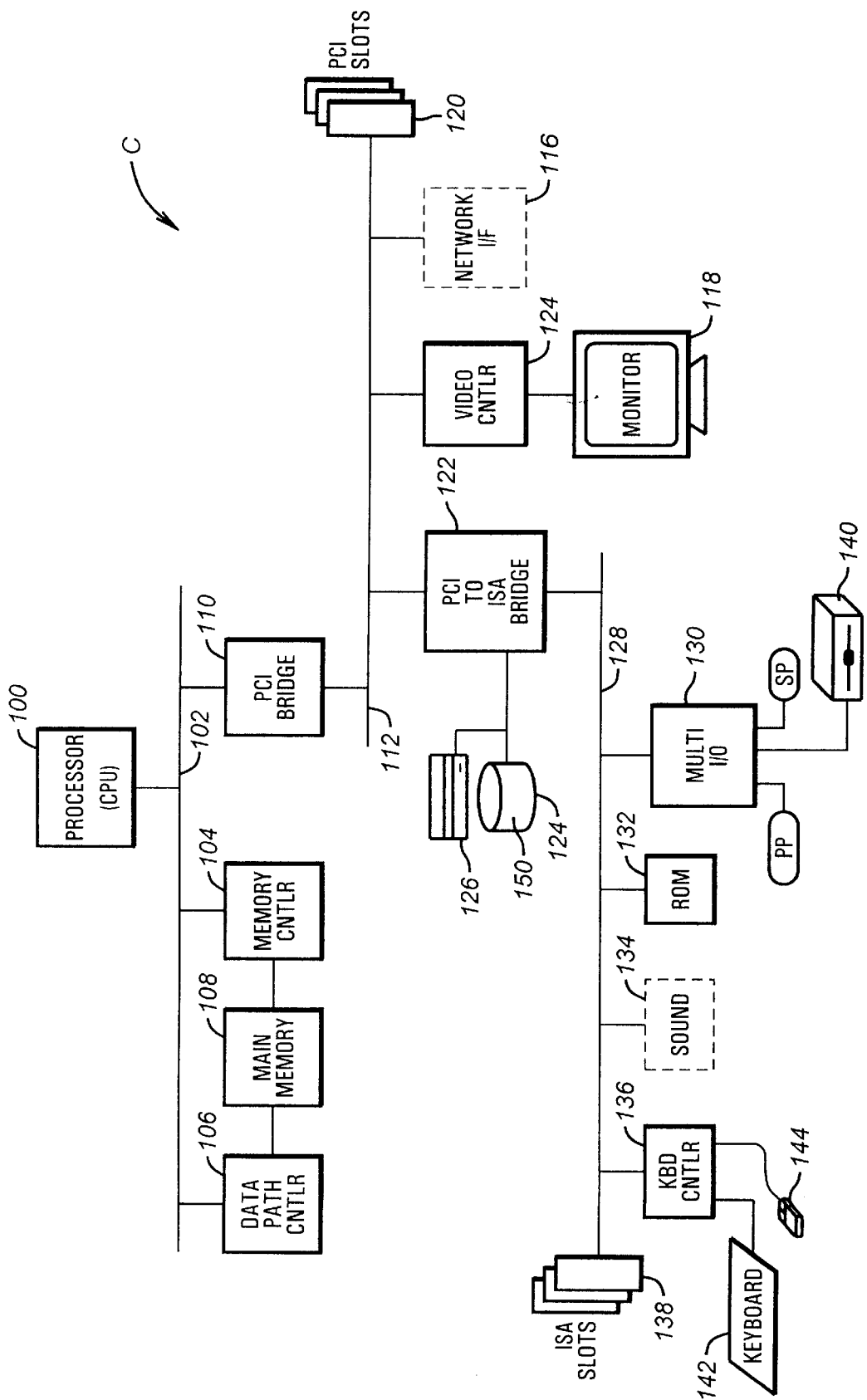
FIG. 1 is a block diagram illustrating a computer system according to the preferred embodiment.

Turning now to FIG. 1, a computer system C suitable for an embodiment of the present invention is shown. A desktop style computer system is illustrated, although as will be discovered, the present invention works equally as well on portables, servers and other types of computer systems. Included in the computer system C is a novel multitasking diagnostic application allowing the computer system C to be tested with a variety of operating systems and hardware configurations.

To provide processing power to perform the diagnostic application, the computer system C includes an 80×86 processor 100, such as a Pentium Pro processor available from Intel Corporation of Santa Clara Calif. The processor 100 is connected via a host bus 102 to a memory controller 104, such as an Intel 82453KX memory controller, and a data path component 106, such as an Intel 82452KX. The memory controller 104 and data path component 106 connect to a main memory array 108 to form a memory subsystem. Certain signals of the memory controller 104 and data path component 106 connect to several memory interface components (not shown), such as an Intel 82451KX memory interface component, to provide buffering and timing control for the data signals of the main memory 108.

In addition to the memory subsystem, the processor 100 connects to a Peripheral. Component Interconnect (PCI) bridge 110, such as an Intel 82454KX PCI Bridge. The PCI bridge 110 provides the necessary logic and control for passing bus cycles between the host bus 102 and a PCI bus 112. The PCI bridge 110 has a synchronous interface to the host bus 102 and the PCI bus 112. From the host bus 102, the PCI bridge derives a PCI bus clock of 25 or 33 MHz to support a synchronous PCI bus interface.

Attached to the PCI bus 112 is a video controller 114, such as a Cirrus Logic CL-GD543X VGA Controller, optional network interface component 116 and several PCI bus slots 120. The video controller 114 includes a video frame buffer (not shown) and is attachable to a monitor 118.

Also attached to the PCI bus 112 is a PCI-to-ISA (Industry Standard Architecture) bridge 122, such as an Intel 82371FB PCI ISA Bridge. The PCI-to ISA bridge 122 integrates many of the common ISA peripherals, such as a DMA (Direct Memory Access) Controller, two Intel 82C59 compatible interrupt controllers and an Intel 8254 compatible timer/counter. The PCI bridge 122 also includes an IDE (Integrated Drive Electronics) interface to connect up to four IDE type devices, such as an IDE hard drive 124, CD-ROM 126 and tape drive (not shown). The PCI-to-ISA bridge 122 passes cycles between the PCI bus 112 and an ISA bus 128. It is understood that hard disk drives, CD-ROMs and tape drives can also be supported from a SCSI (Small Computer System Interface) controller attached to the PCI bus 112 or ISA bus 128. Preferably, the hard disk drive 124, or the like, contains the diagnostic application which is hereby identified as diagnostic application 150.

Attached to the ISA bus 128 is a multifunction I/O peripheral 130, a ROM (read only memory) 132, an optional sound peripheral 134, a keyboard controller 136 and several ISA bus slots 138. The multifunction I/O peripheral 130 is a conventional device providing a pair of serial ports, a parallel port and floppy disk controller for connecting to a floppy disk drive 140. The ROM 132 contains a system BIOS (Basic Input Output System) for bootstrapping the computer and providing a low level firmware interface to the computer system hardware. The keyboard controller is also a conventional device for connecting to a keyboard 142 and mouse 144.

Therefore, the computer system C is comprised of a plurality of individual hardware devices which together form a typical configuration for a computer system. Functionality may be added to the computer system C via the PCI bus slots 120 and ISA bus slots 138. Thus, the scope of the diagnostic application 150 is not limited to the typical computer illustrated in FIG. 1, but only by the number of bus slots and the wide variety of adapter cards available for installation.

When power is supplied to the computer system C, the processor will boot from the ROM and search the hard disk drive 124 and floppy disk drive 140 for an operating system. Preferably a Windows 95 operating system is utilized, however, the present invention works equally well with Windows NT and IBM OS/2. These operating systems are preferred because of their multi-tasking capabilities. A Windows 3.1 operating system is also supported. Once the operating system is booted, the diagnostic application 150 of the present invention can be executed, typically from the hard disk drive 124.

Diagnostic Application Architecture

Referring now to FIG. 2, there is illustrated an architectural diagram of the diagnostic application 150 of the present invention. The diagnostic application 150 is comprised of a number of modules which are divided into functional groups: factory support components 200, diagnostic library components 202, utility components 204, Virtual Device Driver (VxD) components 206 and main components 208.

Main Components Group

Within the main components group 208 there is a front end module 210 which communicates with a product ID module 212 (CQ_PRDID.DLL), a data engine module 214 (CQ_DENG.DLL), a test dispatcher module 216 (CQ_TD.DLL), an error handler module 218 (CQ_ERROR.DLL), a recommended action module 220 (CQ_RACT.DLL) and the diagnostics library 202.

The data engine 214 communicates with an ID 16-Bit module 222 (CQ_ID16.DLL), an ID 32-Bit module 224 (CQ_ID32.DLL) and the diagnostics library 202. The ID 16-Bit module 222 and ID 32-Bit module 224 inspect the computer system C to gather all relevant hardware, firmware and software information. The 16-Bit module is responsible for gathering all of the information corresponding to hardware, firmware or software that must be tested with 16-bit software. The 32-Bit module is responsible for gather all remaining information. Specifically, the ID modules are responsible for gathering: 1) all client management information, such as computer system identification, processor type and speed; 2) user preferences, such as power management and security settings; 3) DOS operating system information, such as AUTOEXEC.BAT, CONFIG.SYS; 4) Windows operating system information, such as WIN.INI, SYSTEM.INI; 5) computer system architecture information, such as expansion bus types (PCI, ISA and EISA), Personal Computer Memory Card and Card Bus interfaces, and Plug-N-Play capability; and 6) miscellaneous information, such as INFO.BOM (a bill of materials for the unit under test), CMOS (non-volatile memory), ECMOS (Extended CMOS) and SIT (System Information Table, a collection of information provided by ROM, such as cache size, memory size and slots).

The product ID module 212 identifies the name of the computer system the diagnostic, application 150 is executing on. Additionally, the product ID module 212 sets the name of the computer system C identified and speed of the processor 100 while initializing internal tables and variables. The information gathered by the product ID module 212, 16-Bit ID module 222 and 32-Bit ID module 224 is called inspect information.

The data engine 214 is the repository of all inspect information gathered by the product ID module 212, 16-Bit ID module 222 and 32-Bit ID module 224 modules and diagnostic libraries 202. The inspect information is gathered upon execution of the diagnostic application 150 and stored in a data structure of the data engine 214. The front end 210 then uses the data engine 214 to display the inspect information to the user during the execution of the diagnostic application 150.

In addition to communicating with the front end module 210, the test dispatcher module 216 communicates with a test engine module 226 (CQ_TENG.DLL). The test engine module 226 is a depository of all diagnostic test information (which tests are valid) gathered by the diagnostic libraries 202. The diagnostic test information is gathered upon execution of the diagnostic application 150 and stored in a data structure, as shown in Table 1, of the test engine 226. The front end 210 then uses the test engine 226 to display the hardware devices and associated diagnostic test to the user.

TABLE 1

Diagnostic Test Data

| Data | Description |
|---|---|
| QuickTest | This test is executed when performing a quick test (one of the test procedures provided) (FALSE = don't execute test, TRUE = execute test) |
| Long Test | This test is executed when performing a long test (one of the canned test procedures provided) (FALSE = don't execute test, TRUE = execute test) |

TABLE 1-continued

Diagnostic Test Data

| Data | Description |
|---|---|
| CustomTest | Whether or not user selected this test to be executed (a custom test procedure created by the user via a series of menus or checkboxes) (FALSB = don't execute test, TRUE = execute test) |
| LaunchTest | Whether or not to launch (execute) test (FALSE = don't execute test, TRUE = execute test) |
| InteractiveTest | Whether or not some portion of the test can be done without involving the user |
| MultiTaskMask | Bitwise field to determine which tests in what categories this test can be multitasked with (1 = can't multitask when a test from this category is running, 0 = can multitask when a test from this category is running) |
| MultiThreadTest | Whether or not user selected this test to be executed multi-threaded or single-threaded. (FALSE = single thread test) (TRUE = multi thread test) |
| NeedWindowForTest | Whether or not the test needs a separate window to be executed |
| DLName | Name of DL this record pertains to |
| DLEntryPoint | Pointer to DL entry point |
| DLModuleHandle | Handle to DL module file |
| DeviceKeyword | Keyword description of device |
| DeviceId | Which device in the DL this test belongs to |
| TestKeyword | Keyword description oftest |
| TestId | ID to be passed to DL that relates this data item to a specific test |

The test dispatcher module 216 is responsible for scanning the list of tests to be run, calling the individual DLs to dispatch the diagnostic tests, controlling the number of active test threads, monitoring the test threads and reporting the status of the tests. The test dispatcher 216 builds an array of records, as shown in Table 2. for performing these tasks.

TABLE 2

Test Dispatcher Data Structure

| Data | Description |
|---|---|
| TestEngineRecordNumber | Record number of the test this record represents in the test engine |
| TestProfileRecordNumber | Record number of the test this record represents in the test profile (TDF file) |
| CategoryMask | Bitwise field to determine if data item is applicable for the category (0 = not valid, 1 = valid) |
| MultiTaskMask | Bitwise field to determine which tests in what categories this test can be multitasked with (1 = can't multitask when a test from this category is running, 0 = can multitask when a test from this category is running) |
| MultiThreadTest | Whether or not user selected this test to be executed multi-threaded or single-threaded. (false = single thread test) (true = multi thread test) |
| NeedWindowForTest | Whether nor not the test needs a separate window to be executed |

TABLE 2-continued

Test Dispatcher Data Structure

| Data | Description |
|---|---|
| DLName[MAX_DL_NAME] | Name of DL this record pertains to |
| DLEntryPoint | Pointer to DL entry point |
| DLModuleHandle | Handle to DL module file |
| DeviceKeyword[MAX_DEVICE_KEYWORD] | Keyword description of device |
| DeviceId | Which device in the DL this test belongs to |
| TestKeyword[MAX_TEST_KEYWORD] | Keyword description of test |
| TestId | Id to be passed to DL that relates this data item to a specific test |
| StopOnFirstError | Should we stop this test on the first error (false = don't stop on first failure true = stop on first failure) |
| NumberOnRetries | Number of times to retry the test before failing it |
| TestNTimes | How many times to execute this test |
| TestParameters | Information needed to process test parameters |
| CurrentLoop | Number of times this test has been executed during the loop (including the current loop) |
| OnePassTimeEstimate | Time estimate to complete 1 pass of the test |
| ElapsedTime | Time elapsed since this test has begun |
| CurrentlyTesting | Is this test currently running or not (false = not currently running, true = currently running) |
| PercentComplete | Test completion percentage (0–100) |
| TestComplete | Whether nor not test is completed (test has been executed and either has a status of passed or failed) (false = Not complete true = Complete) |
| TestStatus | Status of test (0 = Failed, 1 = Passed, –1 = Aborted) |
| NumberOfErrors | Number of errors encountered during the execution of this test |
| StartTickCount | Tick count when the test started |
| EndTickCount | Tick count when the test ended (completed) |
| HeatBeatCount | test's heartbeat count |
| NumberOfHeartbeatsMissed | Test's heartbeat status is initialized to CONDITION_STABLE (= 0). If the test misses 3 heartbeats, it is down-graded to CONDITION_CRITICAL (= 3). If the test misses 2 more heartbeats, it is further down-graded to CONDITION_DEATHBED (= 5). If the test misses another heartbeat, it is terminated. |
| ThreadDataBlock | Handle of data block for the test thread (includes heartbeat count) |
| RecordNumber | Test's record number within the test dispatcher array |
| HaveTestWindow | Whether or not the test currently has a window |

The diagnostic libraries 202 are responsible for identifying all of the hardware devices in the computer system C; specifying the valid tests for each of the hardware devices; relaying all information needed by the front end module 210 to display and allow user selection of diagnostic tests; specifying default test parameters; executing the diagnostic tests; and relaying test status and errors to the front end module 210. It is contemplated that most of the functionality of the ID modules 222–224 could be integrated into the diagnostic library 202. A representative list of diagnostic library components is found in Table 3.

TABLE 3

Diagnostic Library Components

1. AudioCtl (Audio Control)
2. Buttons
3. CDROM
4. CFGMEM (Configure Memory)
5. CPU
6. Decoder
7. Floppy
8. HDIDE (IDE Hard Drive)
9. HDSCSI (SCSI Hard Drive)
10. Joystick
11. Keyboard
12. ISABUS
13. LPT
14. LS120
15. Memory
16. MidiPlay
17. Mixer
18. Modem
19. Mouse
20. Network
21. pcycle (Power Cycle)
22. Comm
23. Usb (Universal Serial Bus)
24. Speaker
25. Timer
26. Tape
27. TVTuner
28. Video
29. WavePlay (Play Wave)
30. WaveRec (Record Wave)
31. ProcDev (Process)
32. Nvs (Nonvolatile Storage)

The error handler module 218 is a depository of all error information (which tests are valid) gathered by the diagnostic libraries 202 when the DLs are executed. It is the responsibility of the DLs to relay all error information to the error handler 218. The error information is stored in a data structure of the error handler 218. The front end 210 then monitors the error handler 218 so that errors can be reported to the user as the tests are performed.

The recommended action module 220 contains information on what to do to fix an error. The error handler 218 uses this information to recommend a corrective action or response to the error. The recommended action module 220 holds several possible recommendations for each possible error.

The front end module 210 is the main program and user interface module. It is responsible for: 1) displaying the graphical user interface (GUI) and all interaction with the user; 2) displaying the inspect information; 3) loading and initializing the DLs; 4) allowing selection and specification of diagnostic tests; 5) launching and monitoring diagnostic tests; 6) displaying test status; 7) displaying all errors and recommended actions; 8) reporting errors to data collection; and 9) validation configuration verification. Because the modules are independent of each other, different front ends 210 can be developed, such as for factory settings or for particular end users. It is also possible for the front end to be executed remotely over a network, such as from a central monitoring station.

Factory Support Components

The diagnostic application 150 has the capability of operating as a factory test tool for testing the computer system C before it is released from manufacturing. The factory support components 200 are provided for this purpose. The factory support components 200 consist of a data collection module 228 (CQ_DC.DLL), a configuration verification module 230 (CQ_CFG.DLL) and a test profile configuration module 232 (CQ_TROF.DLL). Also considered important for factory support, but not specifically a factory support component 200, is a test definition tool 290 (TDT.EXE).

Figure 4A:
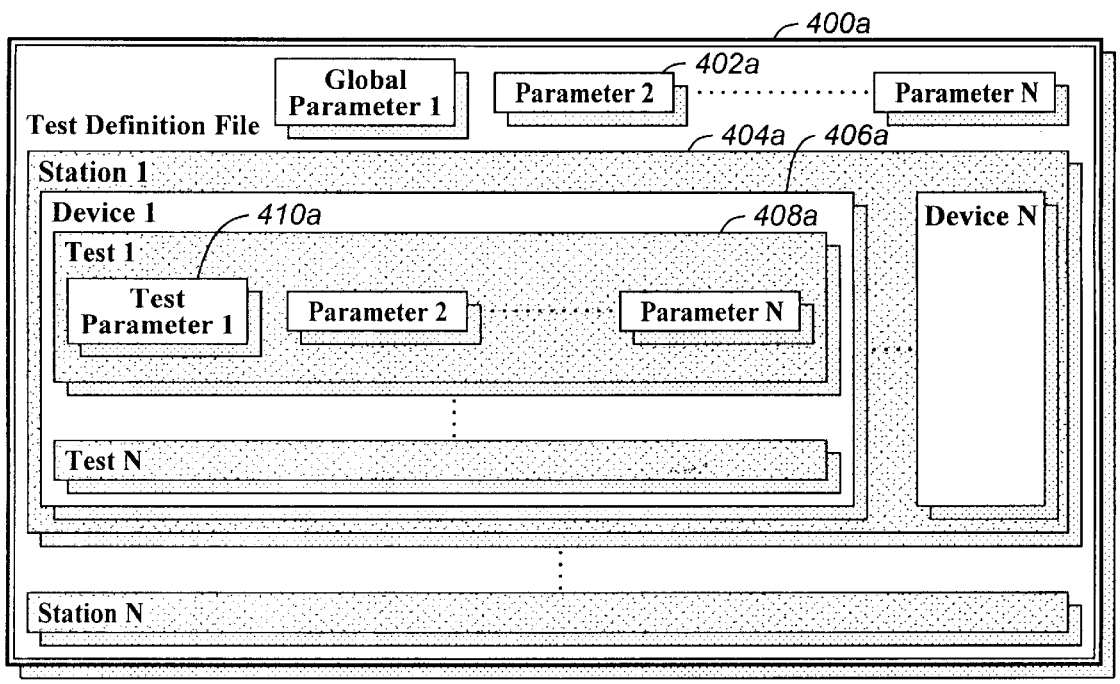
FIG. 4A is a block diagram illustrating the architecture of a test definition file according to the preferred embodiment.

The test definition tool 290 (TDT) is a stand alone application for creating and editing test definition files 400a (FIG. 4A). A test definition file 400a is a hierarchical data structure containing one or more test profiles. In a factory setting, the diagnostic application 150 automatically loads the test definition file 400a to test the computer system C according to the test definition file. Thus, the test definition tool 290 enables factory personnel to run diagnostics quickly and easily, enhancing productivity and saving a large amount of time. More detail on the test definition tool 290 is found below.

The test profile configuration module 232 is responsible for reading the test definition file 400a into the diagnostic application 150 and into a form usable by the test dispatcher 216.

The data collection module 228 is responsible for reporting test information (pass/fail, error code, etc.) in the factory setting. During testing, each computer system C is attached to a local area network. Information gathered by the data collection module 228 is sent to a central repository on network so that statistics can be compiled. In order to accomplish this feat, the data collection module 228 is required to comprehend the local area network and database schemes of the central repository.

The configuration verification module 230 is responsible for verifying that the computer system C has been built according to a bill of materials (BOM) stored in the test definition file.

Diagnostic Library Components

The diagnostic library 202 is a group of independent diagnostic modules 234–268. Each diagnostic module 234–268 targets a specific piece of hardware or software process. In general, the diagnostic modules 234–268 are responsible for: 1) identifying all of the hardware devices in the computer system C; 2) specifying valid tests for the hardware devices; 3) relaying all information needed by the front end module 210 to display and allow selection of diagnostic test; 4) specifying default test parameters; 5) executing the diagnostic test(s); and 6) relaying test status and errors to the front end 210.

The diagnostic modules 234–268 are provided in the form of dynamic link libraries (DLL). An individual DLL is a set of source code modules, with each module containing a set of functions which can be called by any application. More in depth information on DLLs can be found in "Advanced Windows," by Jeffrey Richter and published by Microsoft Press, hereby incorporated by reference. A Diagnostic Library (DL) is a particular DLL written for the Diagnostic Application of the present invention. More information on typical diagnostic library components can be found in U.S. patent application Ser. No. 08/777,663, entitled "Driver Level Diagnostics," by Thanh V. Hoang and Paul Fontenot, filed Dec. 31, 1996 and hereby incorporated by reference.

Utility Components

The utility components 204 are comprised of a utility module 270 (CQ_UTIL.DLL), a thunk16 module 272 (CQ_THK16.DLL), a thunk32 module 274 (CQ_THK32.DLL), a get message/add message module 276 (CQ_GMSG.DLL) and a message builder module 278 (WDIAGMSG). The utility module 270 contains functions and routines that are used by more than one DLL. The thunk16 module 272 and thunk32 module 274 are small chunks of code to handle the transitions between 16 bit and 32 bit code. The get message/add message module 276 provides an interface to the message builder module 278. The message builder module 278 is responsible for creating a message file for multiple language support. The get message/add message module 276 verifies that the message file is valid, determines which language to use (such as German), loads the messages for a specific language into memory and allows the addition of new messages at run-time. Thus, languages can be changed at run-time without exiting the diagnostic application 150.

Figure 2A:
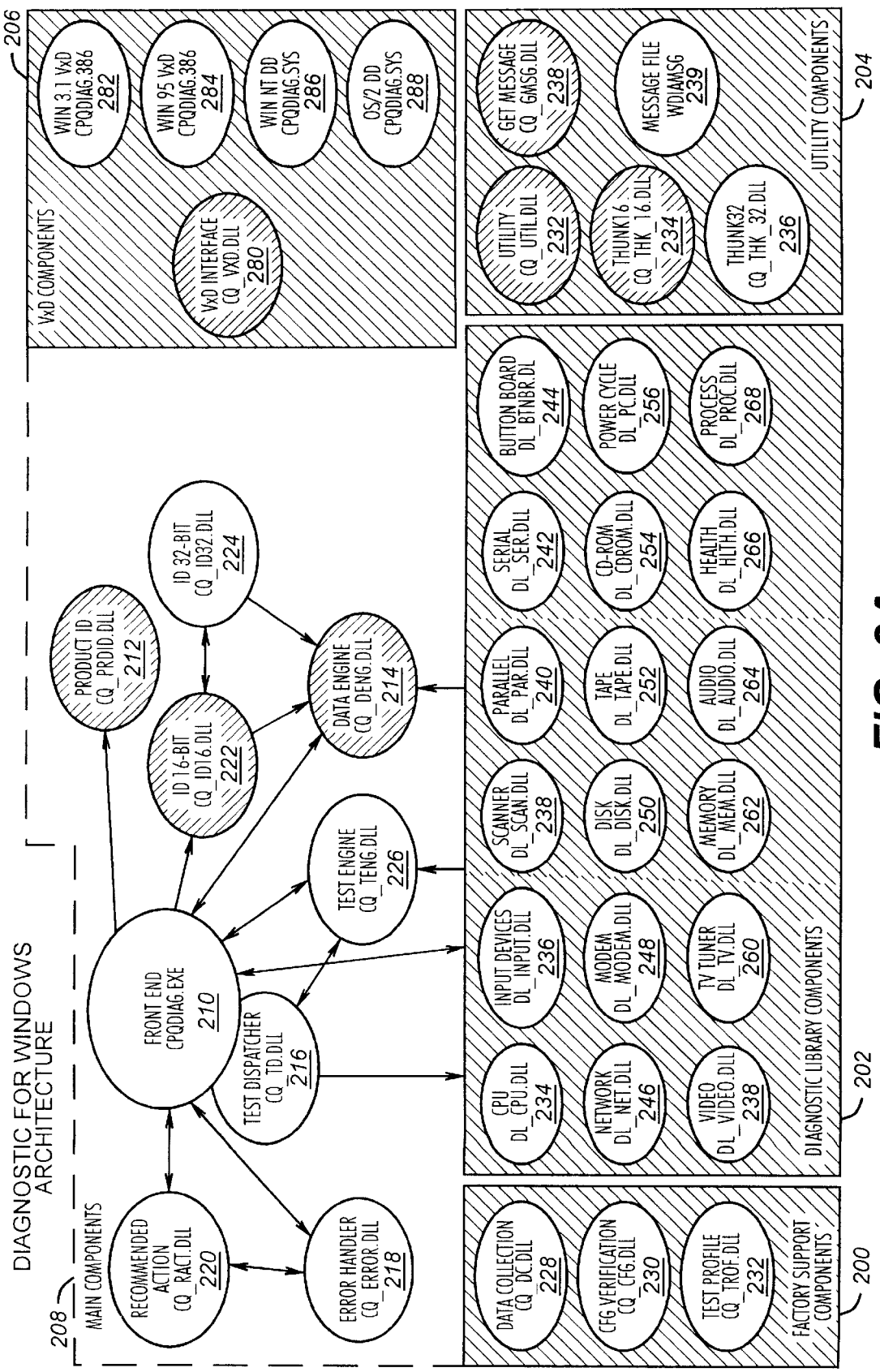
FIGS. 2A–B are block diagrams of the diagnostic application illustrating the architecture of the diagnostic application according to the preferred embodiment.
Figure 2B:
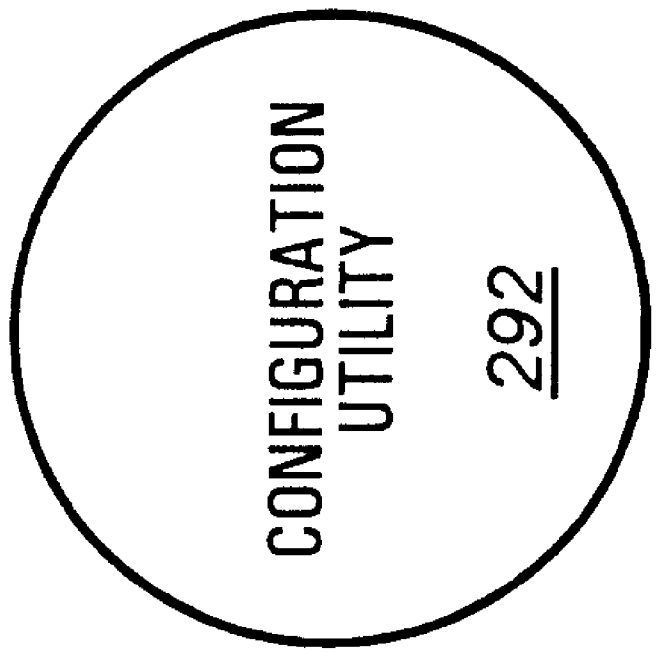
Figure 2B:
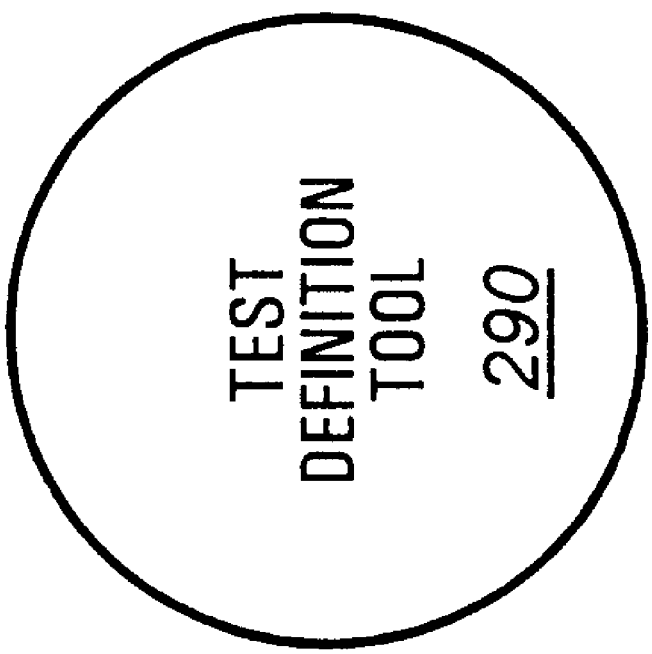
Figure 2C:
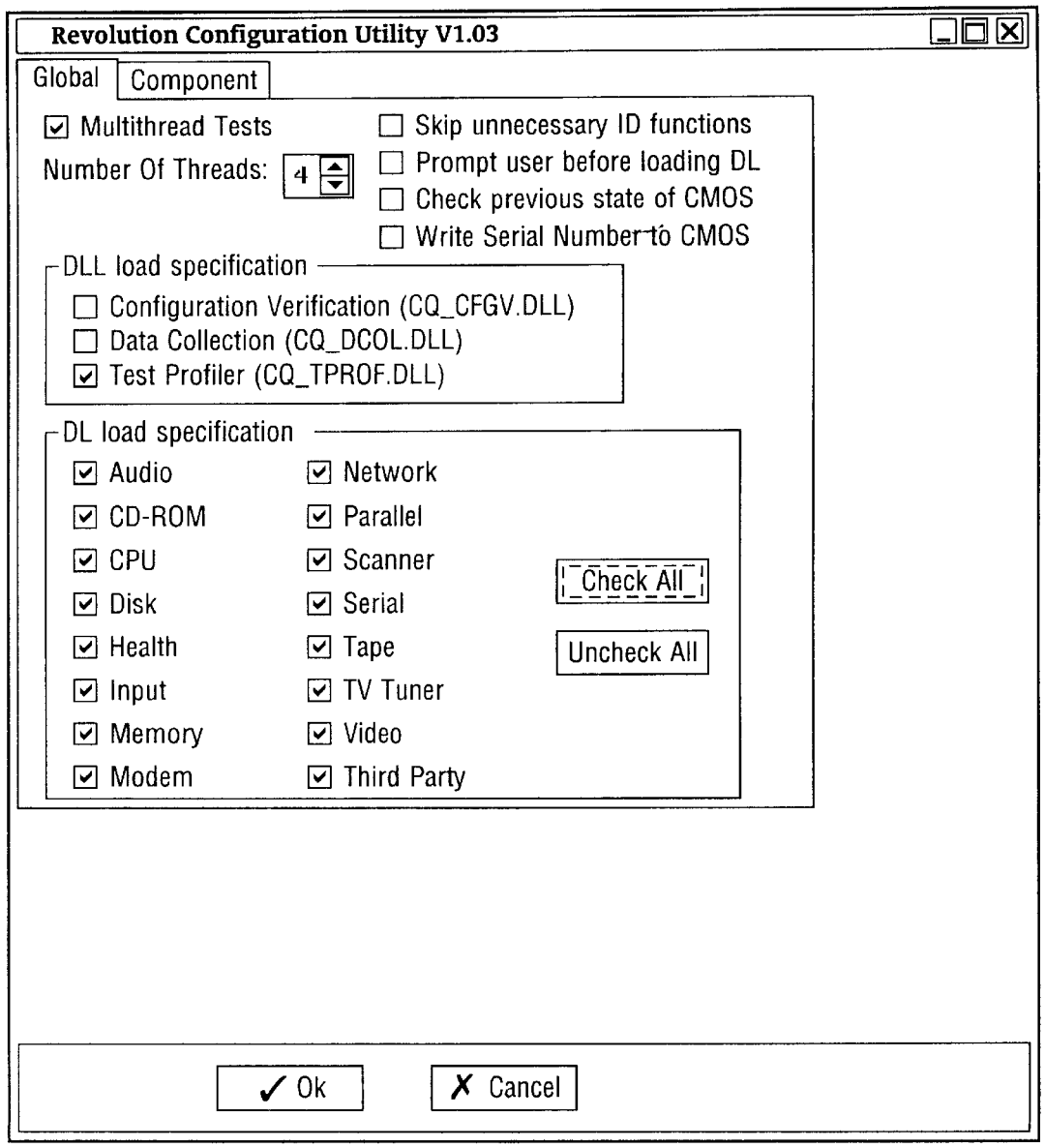
FIGS. 2C–D are screen snapshots illustrating global configuration selections and component configuration selections of the diagnostic application according to the preferred embodiment.
Figure 2D:
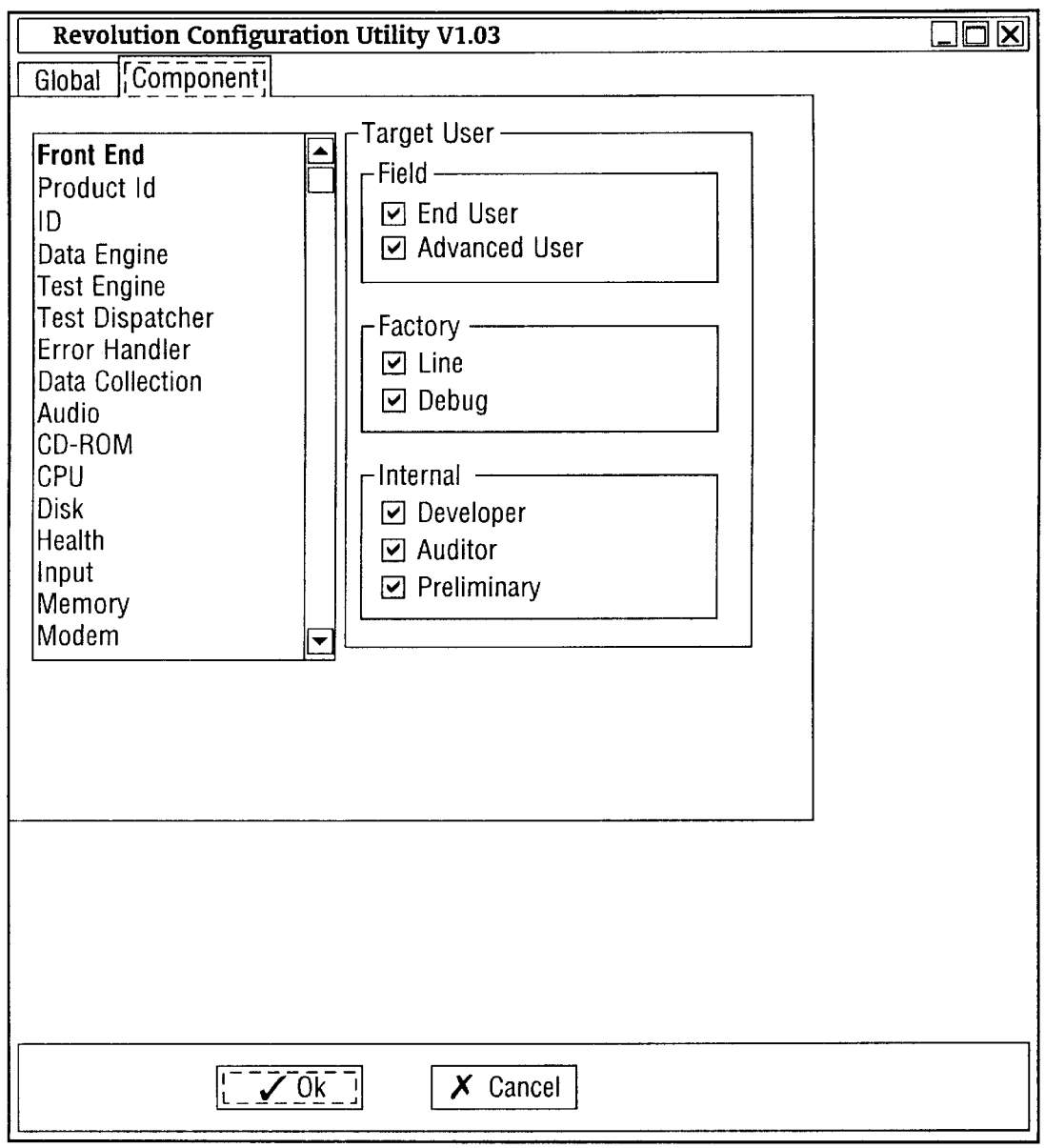

Also considered a utility of the diagnostic application 150, but not specifically a utility component 204, is a configuration utility 292 (FIG. 2B). The configuration utility is a stand-alone application used by an end-user to configure the diagnostics application 150. The configuration utility 292 consists of two main areas—a global area (as shown in FIG. 2C) and a component area (as shown in FIG. 2D).

The global configuration options effect all tests run by the diagnostic application 150. For example, whether multi-tasking is desired and the number of multi-tasking threads to be run at any one time.

The component configuration options allow individual components to have different configuration options which apply to all tests run by the diagnostic application 150. For example, the front end 210 can be configured for target users such as field users, factory personnel and internal personnel.

Virtual Device Driver Components

The virtual device driver components 206 consist of a VxD driver interface module 280 (CQ_VXD.DLL), a windows 3.1 VxD 282 (CQDIAG.386), a windows 95 VxD 284 (CQDIAG.386), a windows NT device driver 286 (CPQDIAG.SYS) and an OS/2 device driver 288 (CPQDIAG.386).

Virtual device drivers (VxDs) are Windows 95 device drivers that virtualize a particular hardware device among multiple programs that use the hardware. VxDs are like DLLs in that they can be dynamically loaded and unloaded, thereby allowing better memory management, and unlike Windows 3.1 device drivers for the same reason. If the diagnostic application 150 is run on a Windows 3.1 operating system, the diagnostic capabilities are not available but the inspect information is. A VxD can be associated with more than one device or no devices at all. More information on VxDs and DLLs can be found in A Windows 95 System Programming Secrets= written by Matt Pietrek, 1995, and published by IDG Books, hereby incorporated by reference.

Except for the VxD driver interface 280. each device driver 282–288 provides an operating system specific driver to communicate directly with hardware. The VxD driver interface 280 interfaces one of the remaining virtual device driver components 206 to the operating system. The VxD driver interface 280 is responsible for initializing the Windows NT device driver 286. All calls to the remaining virtual device driver components 206 pass through this component.

Therefore, the modularization of the diagnostic application 150 allows the front end 210 to be independent from the diagnostic libraries.

Phases of Communication Between Modules

Figure 3:
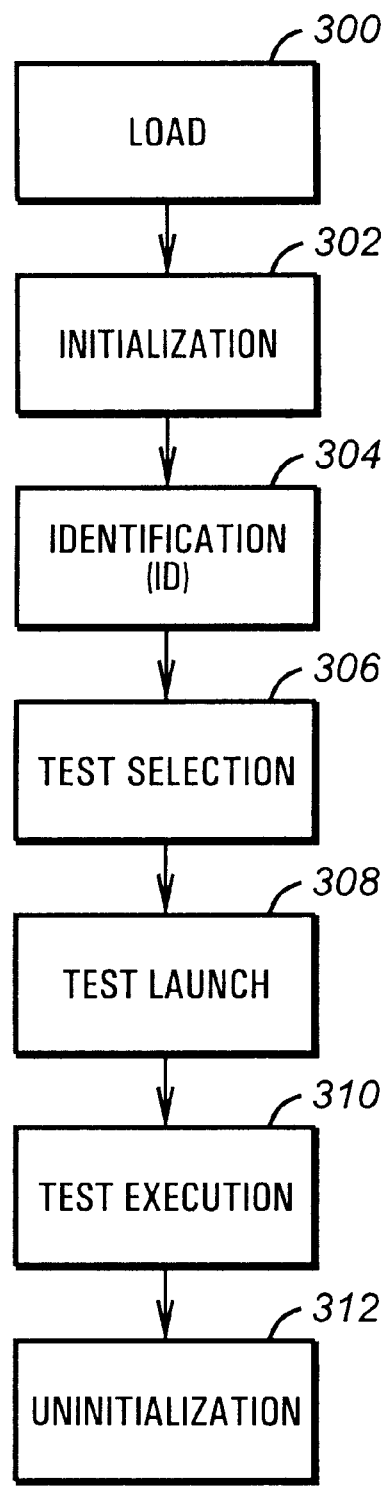
FIG. 3 is a flow diagram illustrating a sequence of phases of the diagnostic application according to the preferred embodiment.

Now referring to FIG. 3, there is illustrated the main phases of communication between the front end 210 and the diagnostic libraries (DLs) 202. The communication phases are: loading 300, initialization 302, identification (ID) 304, test selection 306, test launching 308, test execution 310 and uninitialization 312. Generally, the front end 210 issues commands to begin these phases. The modules coupled to the front end 210, such as the test dispatcher 216, receive the commands and cause other modules, such as the DLs to respond.

To execute the diagnostic application 150, the user launches the front end module 210. After the front end module 210 is launched, it begins the loading phase 300, where the front end 210 searches for and dynamically loads all of the DLs 234–268 (via a Windows API LoadLibrary command). The results are stored in a DLLoadTable. While loading each of the DLs 234–263, the front end 210 determines an address of a single entry point of each DL (via the Windows API GetProcAddress command). The address is stored in the DLLoadTable. All function calls from the front end 210 to a DL 234–268 occur through these single entry points. Each DL has an entry point (DLEntryPoint) for calling the DL.

Dynamically loading the DLs 234–268 provides the capability to add and remove the DLs at runtime without recompiling and releasing. Thus, the diagnostic application 150 can run with or without a particular DL 234–268.

The diagnostic application 150 contains a dynamic link library (DLL) load table (DLLoadTable) which defines how all DLLs are loaded, including the DLs 234–268. The table causes all known DLs to be loaded first in a predefined sequence. After all of the known DLs have been loaded, the front end 210 searches the working directory of the diagnostic application 150 for third party DLs (those DLs not listed in the DLLoadTable). All third party DLs conforming to a naming convention of DL?????.DLL, where ????? represents a description of the DL, are loaded. Once loaded, the third party DLL is added to the DLLoadTable.

The loading phase is complete when all of the DLs have been loaded and their entry point has been found (via the Windows API GetProcAddress command). If an invalid address is returned on the GetProcAddress command, the error is reported to the user.

The initialization phase 302 occurs after the DLs 234–268 have been loaded. During the initialization phase, the front end 210 issues an initialization command (DL_INTIALIZE) to each DL 234–268 that is loaded. During this phase, the DL 234–268 performs whatever initialization it needs (i.e., allocating resources) to identify (ID) and test the devices for which it is responsible. During initialization, one instance of each DL class is created. Thus, a single instance is available to multiple tests and not tied to one specific device. While initializing, the DLs perform a compatibility check with the front end 210. If not compatible, an error is reported to the user.

The identification (ID) phase 304 occurs after the DLs have been initialized. The front end 210 issues an ID command (DL_ID) to each DL that is loaded. In response, each DL identifies all of the devices for which it is responsible. Identifying all of the devices includes: 1) identifying all of the devices (device objects) for which the DL is responsible; 2) identifying all of the tests (test objects) that are valid for each device the DL finds; 3) determining the test parameters for each test; 4) relaying all information about the devices and tests to the test engine 226 (i.e. whether the test can be multitasked with other tests); and 5) relaying all configuration information to the front end 210.

The test selection phase 306 is controlled by the user and occurs sometime after the diagnostic application 150 is launched and the user interface is available. The user selects or unselects a type of test (quick test, complete test or custom test), mode of test (interactive or unattended) and specific tests. During this phase, the front end 210 and test engine 226 communicate with the DLs 234–268 by modifying the test parameters as changed by the user.

The test launching phase 308 is controlled by the user and occurs sometime after the test selection phase 306. The user initiates this phase by selecting a Begin Testing button on the GUI. During this phase, information needed to launch and monitor the tests are copied from the test engine 226 to the test dispatcher 216.

The test dispatcher 216 is the component responsible for launching and monitoring the test execution. The test dispatcher 216 scans the list of tests to run and launches each test by issuing a launch command (DL_LAUNCH) to the DL to which the test belongs.

Once the DL receives a launch test command, the DL determines which test to run and which device to test. Once the device and test are determined, the DL starts a thread for the test to run in and immediately returns control to the test dispatcher.

The test execution phase 310 occurs after a test has been launched. During this phase, the test dispatcher 216 continues to scan the list of tests for additional test to be run. The test dispatcher 216 controls the number of active tests running and reports status to the front end 210. Based upon the information gathered during The ID phase 304 and test selection phase 306, the test dispatcher 216 attempts to launch multiple multi-taskable tests up to a user-defined maximum number of test threads. If a test is not multi-taskable, the test dispatcher 216 individually launches the tests in a sequential fashion.

During the test execution phase 310, there are at least two threads running—the thread in which the front end 210 is running and the thread in which the test is running. The test thread tests the device and reports progress to the front end 210. The front end 210 is responsible for responding to posted messages and monitoring all of the test threads running. If the test currently executing can be multitasked with other tests, the front end 210 can be operating in the test launching phase 308 and test execution phase 310 at the same time. Hence, it can be responding to and monitoring tests, while launching other tests.

Finally, the uninitialization phase occurs when the user exits the diagnostic application 150. The front end 210 frees all of the resources used and issues an uninitialization command (DL_UNINITLALIZE) to each DL 234–268 that is loaded. In response, the DLs 234–268 free all resources that they have allocated during the initialization phase 302, ID phase 304 and execution phases 310.

Test Definition Tool

Figure 4E:
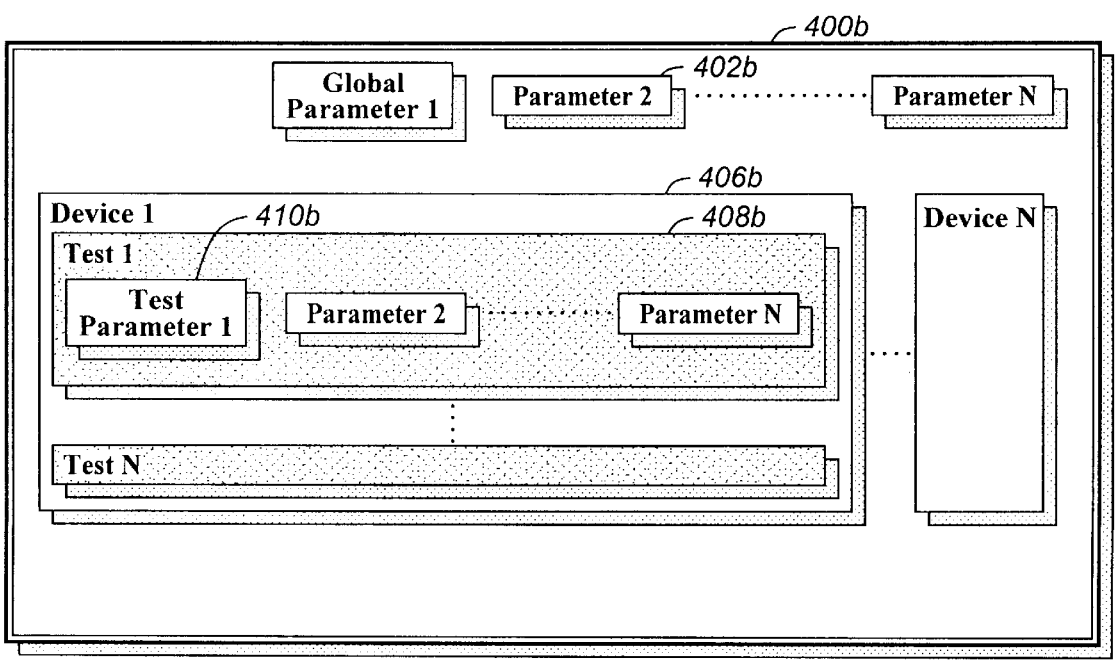
FIG. 4E is a block diagram illustrating the architecture of a user defined test profile according to the preferred embodiment.
Figure 4B:
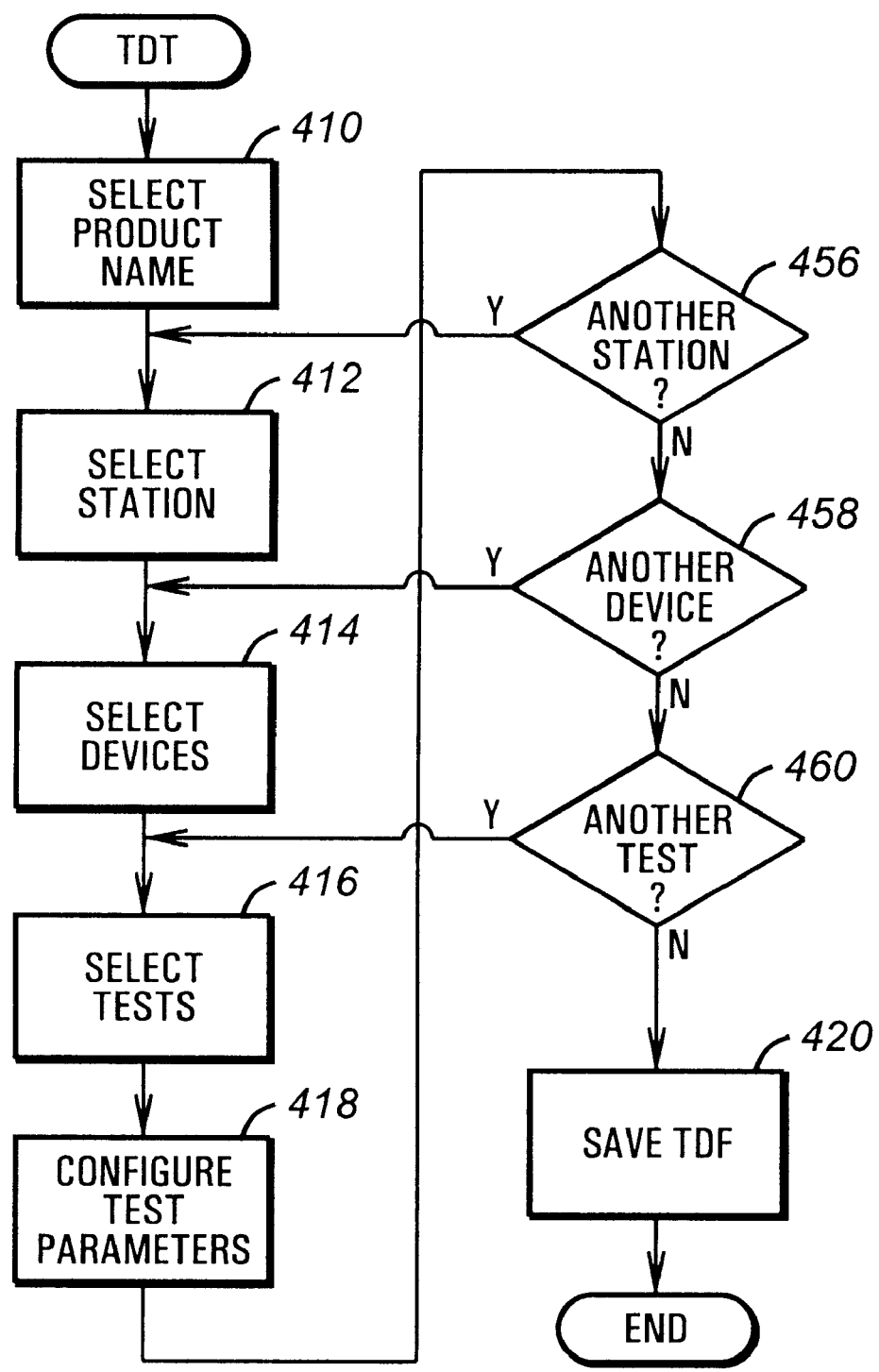
FIG. 4B is a flow diagram illustrating a sequence of events for developing a test definition file according to the preferred embodiment.
Figure 4C:
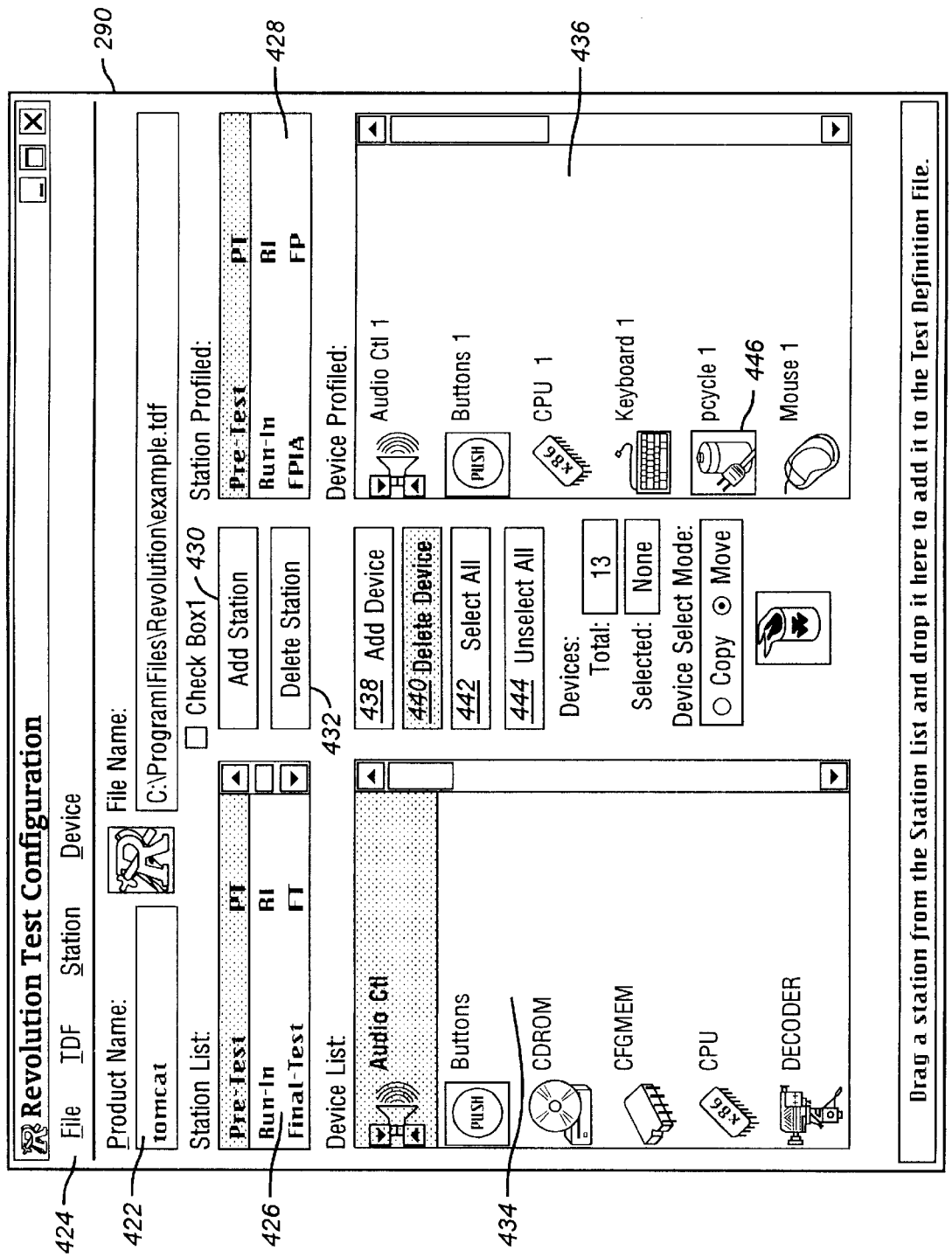

Now referring to FIGS. 4A–D, there are illustrated various diagrams of the test definition tool (TDT) 290. FIG. 4A illustrates the architecture of the test definition file (TDF) 400a produced by the test definition tool 290. FIG. 4B illustrates a flow diagram showing a series of steps to be performed with the test definition tool 290. FIGS. 4C–D illustrate screen snapshots of the GUI of the test definition tool 290.

The test definition tool 290 is a stand-alone, factory support application designed for creating and editing test profiles. With this tool, factory personnel can easily develop test profiles without having to understand any programming or scripting languages.

Once the TDF 400a is created, the TDF 400a is placed on the hard disk drive 124 of each computer system C to be tested. Of course, the TDF 400a could be placed on other forms of media, such as floppy, CD-ROM and tape or retrieved over a network connection. The TDF 400a is placed into the directory of the diagnostic application 150 so that it can be loaded automatically when the diagnostic application 150 is launched by factory personnel on an assembly line. Different sets of tests can be prepared for key test points or stations along the assembly line. If the computer system C or unit under test (UUT) contains a network I/F controller 116, the diagnostic application 150 can report test results to a central monitoring station.

Another advantage of the test definition tool (TDT) is that test definition files can be developed off-line so that a representative computer system C is not required in order to produce a test definition file 400a. Therefore, the development of test definition files can be disjoined from engineering (hardware). Before describing the test definition tool, it is first important to understand the test definition file 400a.

Referring now to FIG. 4A, the test definition file is shown as a structure comprised of a hierarchy of objects. There is one test definition file 400a for each computer system C product family, such as a Compaq DeskPro 6000 family. Preferably, the single TDF is general enough to handle all possible build configurations of the product family. At a top level, the TDF has global parameters 402a and station profiles 404. The global parameters 402a are comprised of 1) a stop on first error parameter, 2) a maximum number of threads parameter, 3) a number of hours for the test to run parameter, and 4) a number of minutes for the test to run parameter.

A station profile 404a contains a list of devices 406a that are to be tested at a particular test station. By default, the TDF 400a has three stations profiled: 1) pre-test, 2) run-in and 3) FPIA (final product integrity audit). A device 406a is an item installed in the unit under test (UUT) and contains a list of tests 408. A test is a discrete operation which can be performed on a device to determine if it is functioning as intended. Tests 408a each have a list of test parameters 410a associated with them to control the behavior of the test to which they belong.

Now referring to FIGS. 4B–D, a method of creating the test definition file (TDF) will be explained. At a step 410, the user selects a product name of the computer system to be tested. If a TDF has not yet been created, the product name is entered in the product name field 422 of the test definition tool 290. If the TDF has already been created, the user can open the existing TDF by selecting an Open command (not shown) from the File menu 424.

At a step 412, the user selects a station 404a to profile from a station list 426 of the TDT 290. The selected station 404a may then be added to a stations profiled list 428 via drag and drop techniques. Alternatively, a station 404a may be added or deleted via an add station button 430 and a delete station button 432. The user has the option of selecting one or more stations 404a to load into the stations profiled list 428. The user can also arrange the stations 404a in the stations profile list 428 in any particular order by dragging them vertically until arranged in a suitable order.

Each profiled station 406a should have a list of devices which specify which devices 406a are to be tested at the station 406. At a step 414, for a given profiled station 404, the user selects one or more devices 406a to profile from a device list 434 of the TDT 290. The selected station may then be added to a devices profiled list 436 via drag and drop techniques. Devices 406a may also be added and deleted individually or as a group with buttons 438–444. The devices 406a are tested in the general order they appear on the GUI. Because some tests 408a are multi-threaded, some are single-threaded, and some are interactive, the actual order of testing can vary. A power cycle device 446 places a boundary between the tests so that devices 406a listed above and below the power cycle device 446 are not tested together. Some devices 406a are exclusively singular (i.e. keyboard 142), but some devices 406a can appear more than once on a single unit (i.e. two hard disk drives 124 or two serial ports). Multiple installations of a single device 406a is distinguished by a device number appearing to the right of the device name in the devices profiled list 436.

Next at a step 416, the user selects tests 408a to profile. The user double clicks on a device 406a from the devices profiled list 436 to open a test list screen 450, as shown in FIG. 4D.

Next at a step 418, the user configures the test parameters 410a listed on the test list screen 292. The test list screen 292 consists of two rectangular boxes and five buttons. The first box 452 lists the device type and number (CDROM having device number 1 in this example). The second box 454 lists the tests 408a (sequential seek test, random seek test and converging seek test, in this example) and test parameters 410. In this example, the sequential seek test has parameters 410a for threading, start sector, end sector and increment sector. The DLs 234–268 initially select the tests 408a and set the default values for the parameters 410. Of course, the user can change any of these values. A number of tests 408a contain no parameters, in which case the parameter boxes will not appear on the test list screen 450.

The tests column in the second box 454 consists of all the tests 408a that the user can run on a given device. A check box next to each test name indicates whether the test is to be executed. A check box to the right of each test name indicates whether the test can be multi-tasked with other tests 408. If a test cannot be multi-tasked, the check box will not appear.

After step 418, the user may repeat steps 412–418 to select additional stations 404, devices 406a or tests 408. Although the steps of the flow diagram of FIG. 4B are arranged in a linear fashion, the user can make the selections in almost any order desired.

After all stations 404, devices 406, tests 408a and parameters 410a have been selected and configured, the user proceeds to step 420 where the profiled information is compiled and stored into the test definition file 400a. Because some tests are multitaskable while other tests are single threaded, the compiling process may optimize the test scripts so that the tests run in the least amount of time. Thus, the test definition tool 290 provides a very easy method of creating a test definition file, or test scripts.

Now referring to FIG. 4E, there is illustrated a structure of test profiles 400b developed interactively when there is no TDF available. This structure is developed from the information copied from the test engine 226 to the test dispatcher 216 and subsequently configured by a user. It is comprised of global parameters 402b, testable devices 406b, device tests 408b and test parameters 410b which are similar to those of the TDF 400a.

Figure 5A:
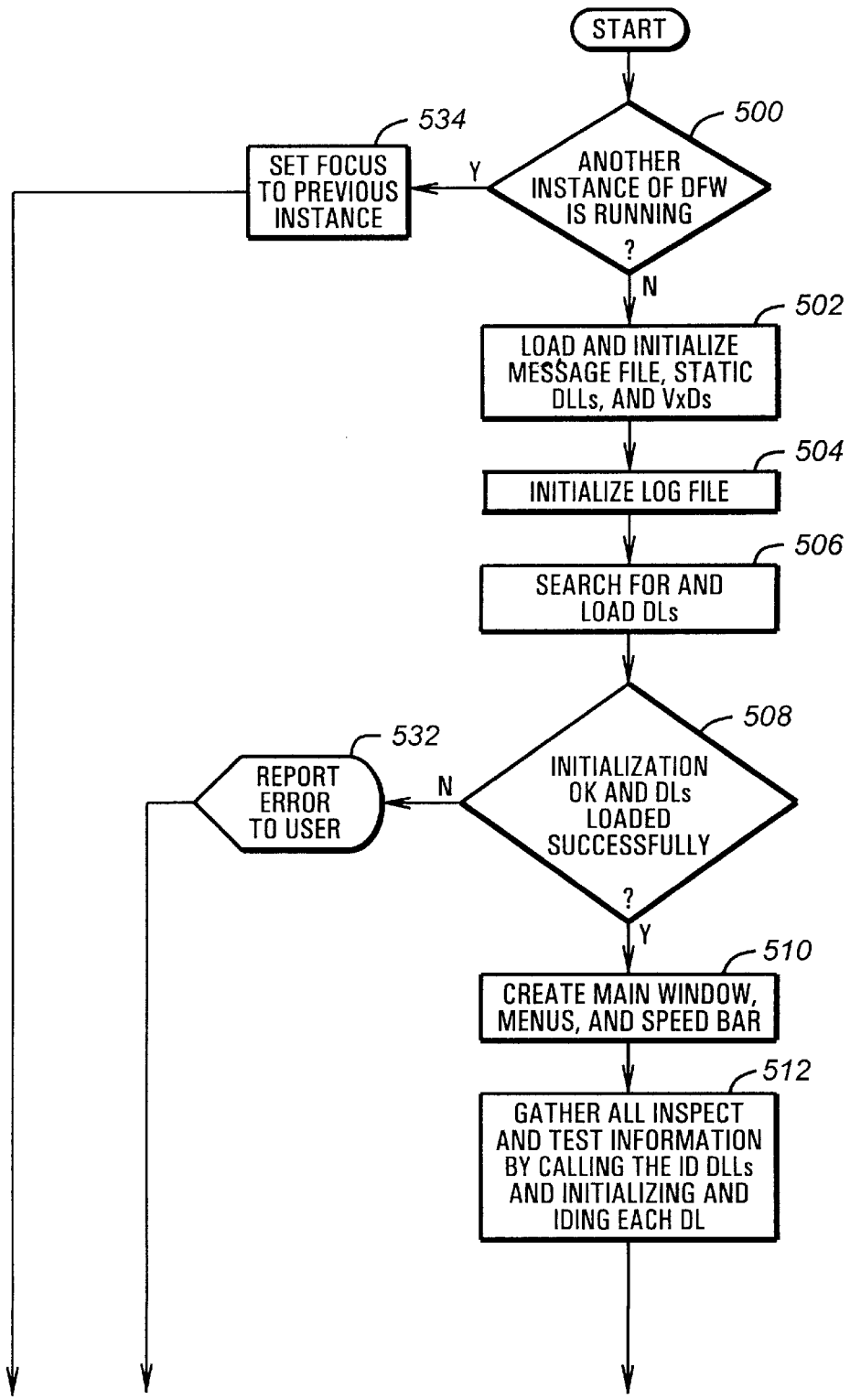
FIGS. 5A–C are flow diagrams illustrating a sequence of events in the execution of the diagnostic application according to the preferred embodiment.
Figure 5B:
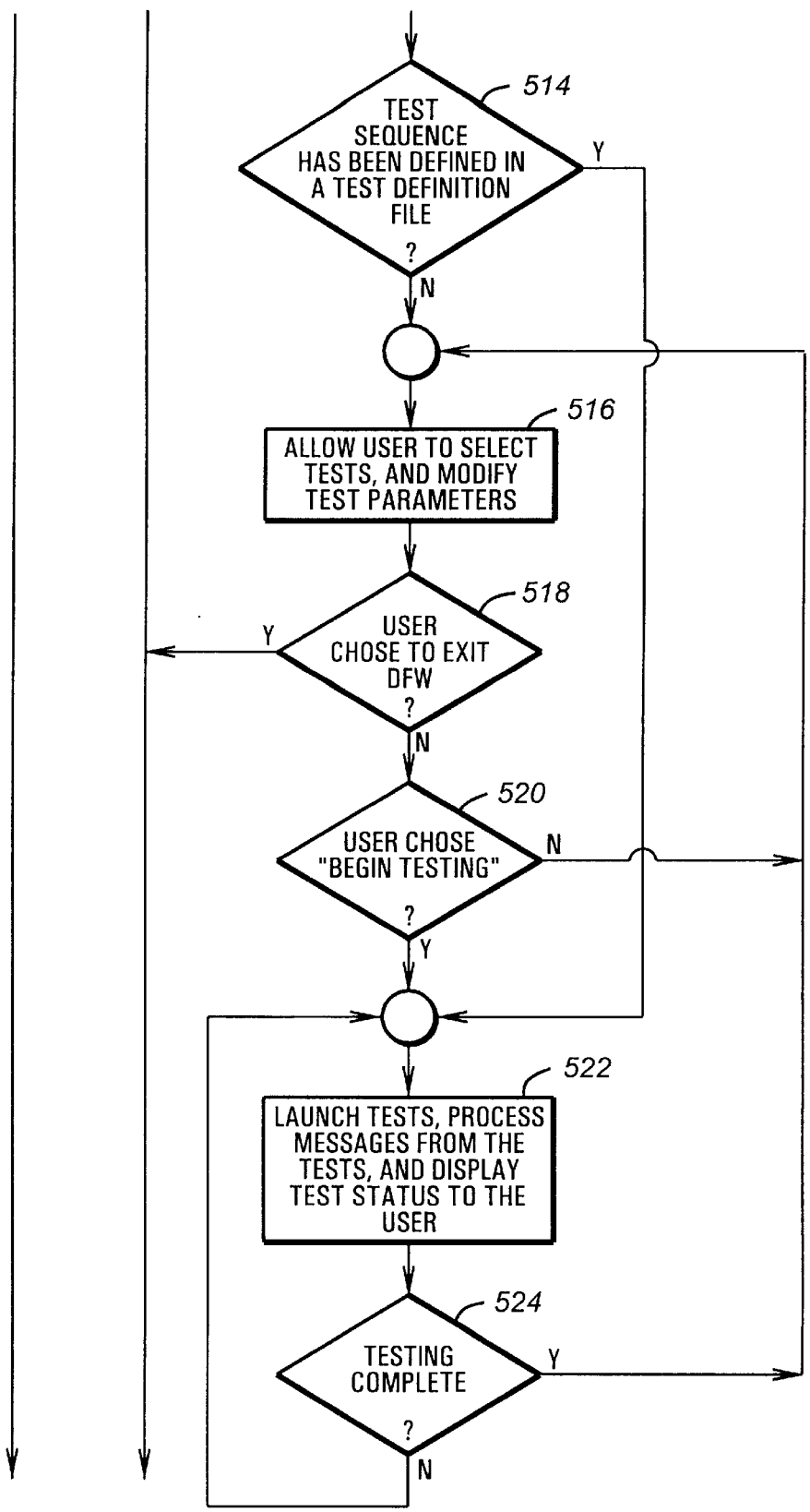
Figure 5C:
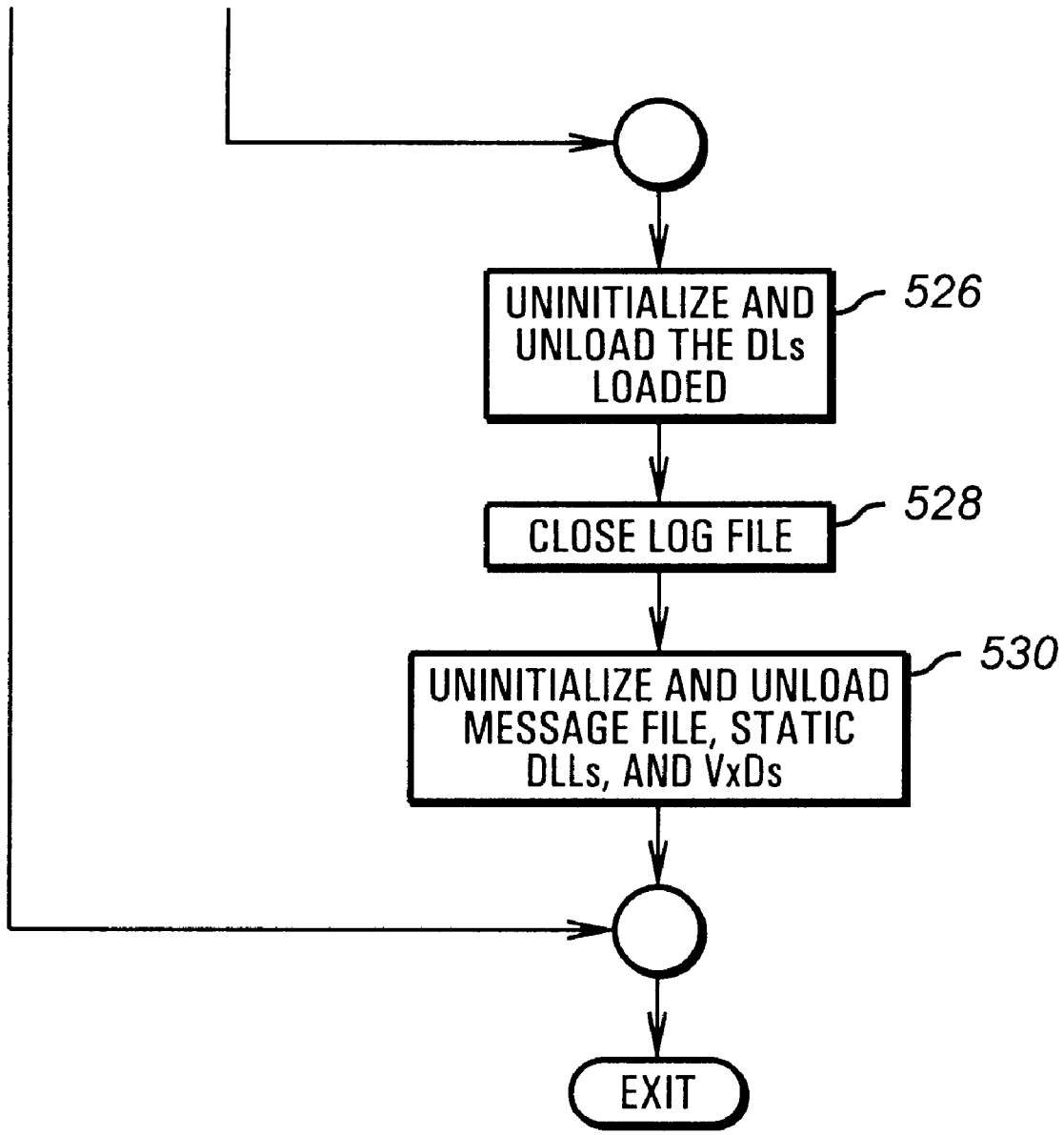
Figure 6A:
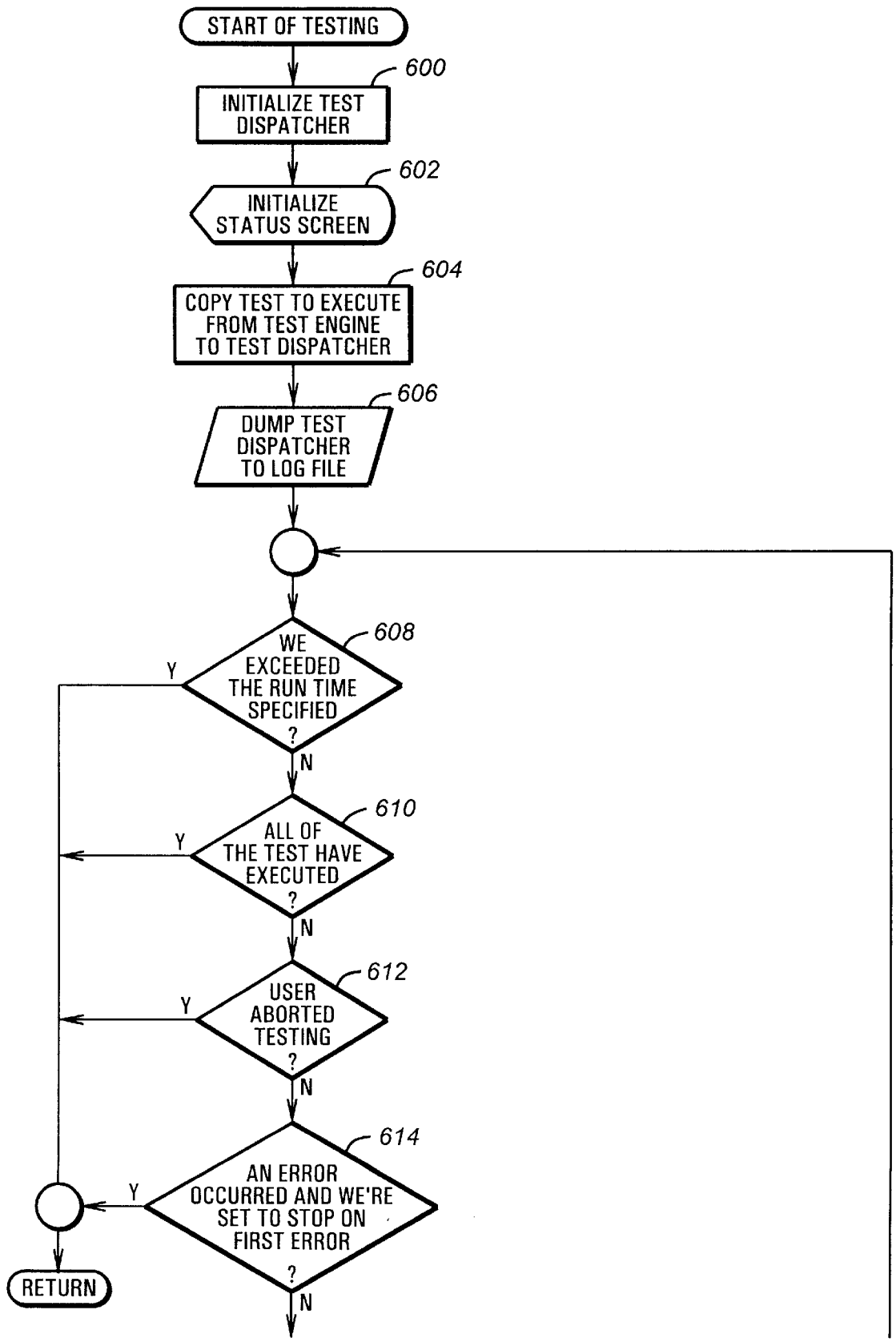
FIGS. 6A–E are flow diagrams illustrating a sequence of events in the execution of a test dispatcher according to the preferred embodiment.
Figure 6B:
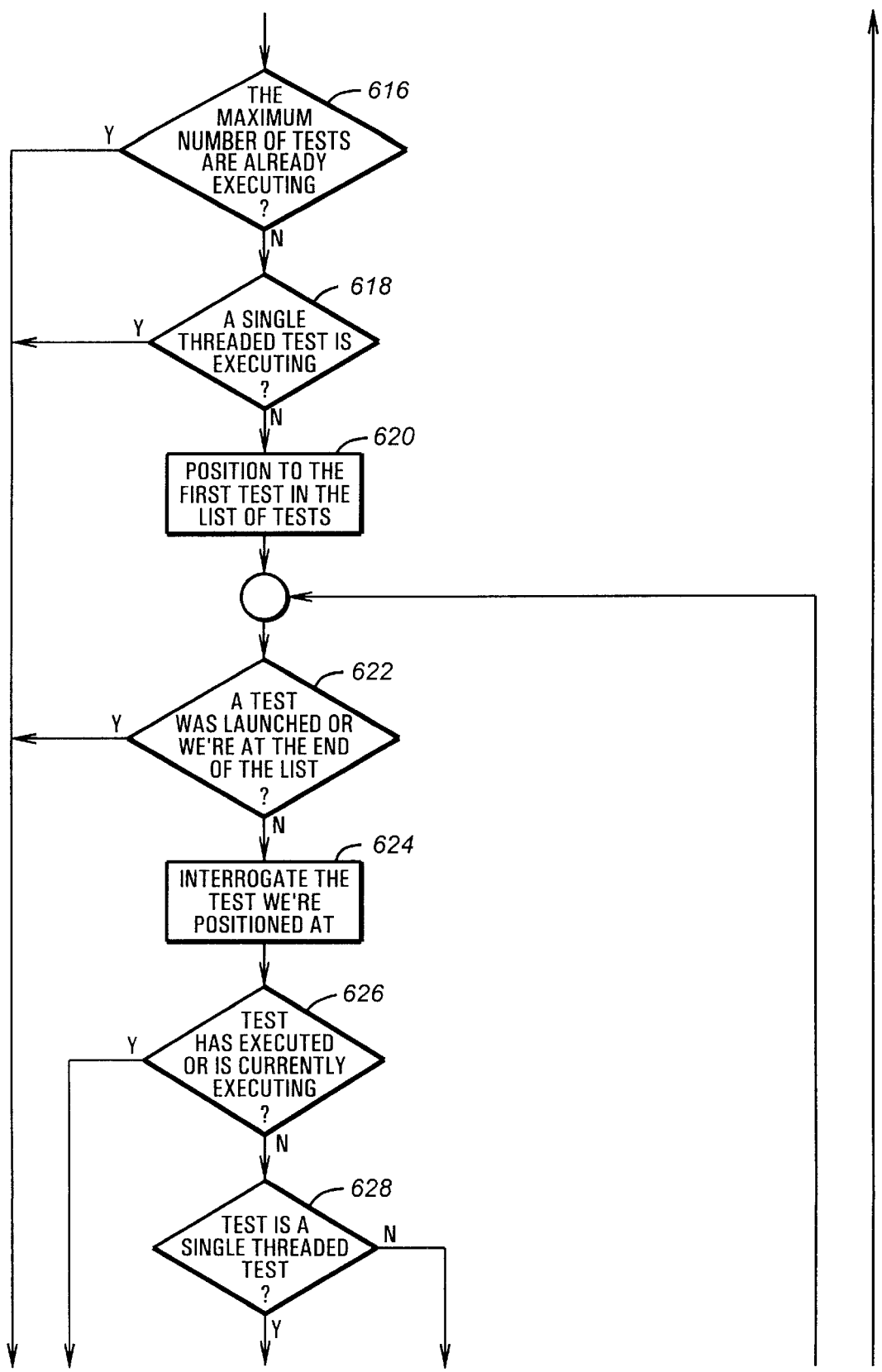
Figure 6C:
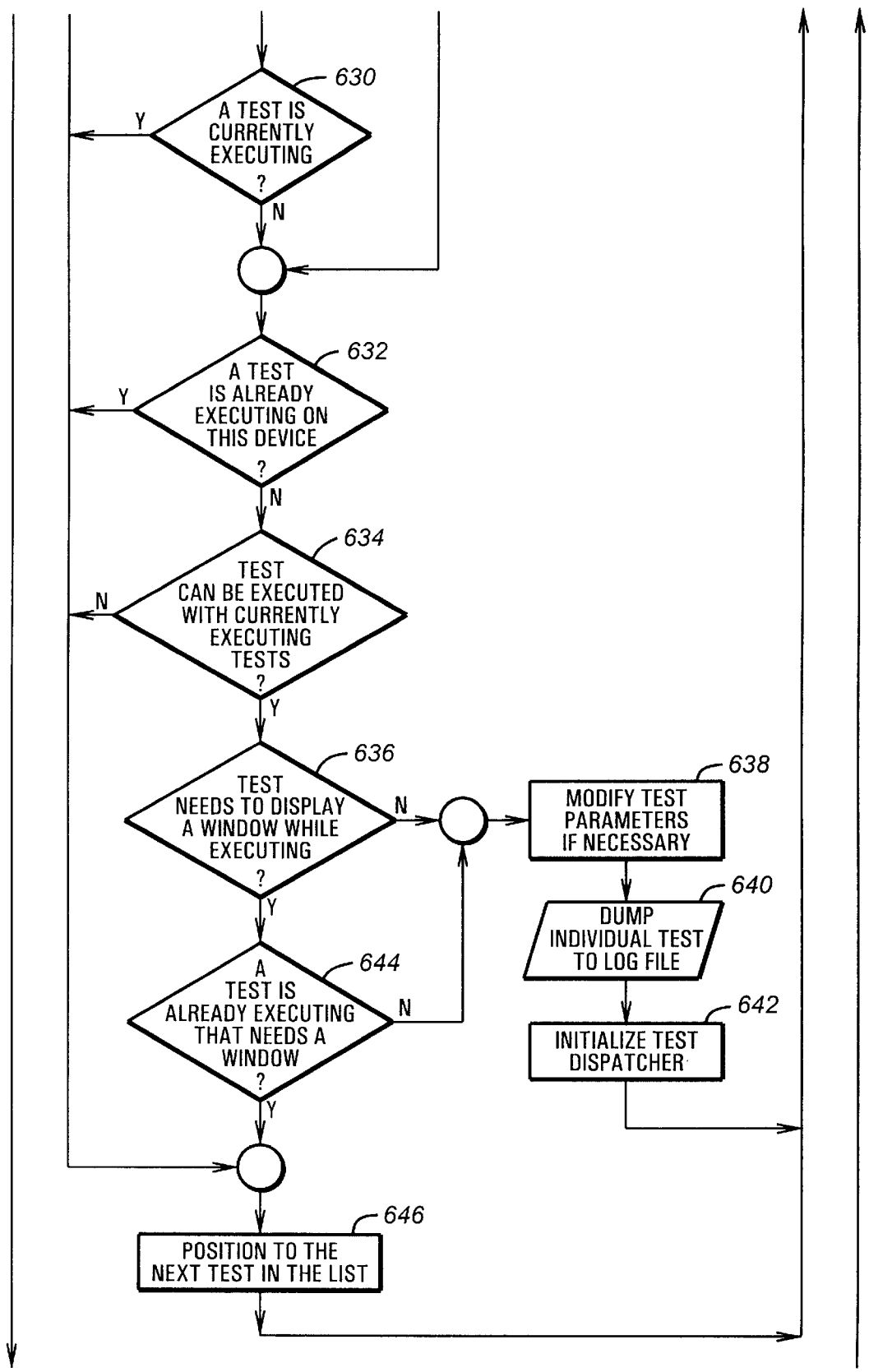
Figure 6D:
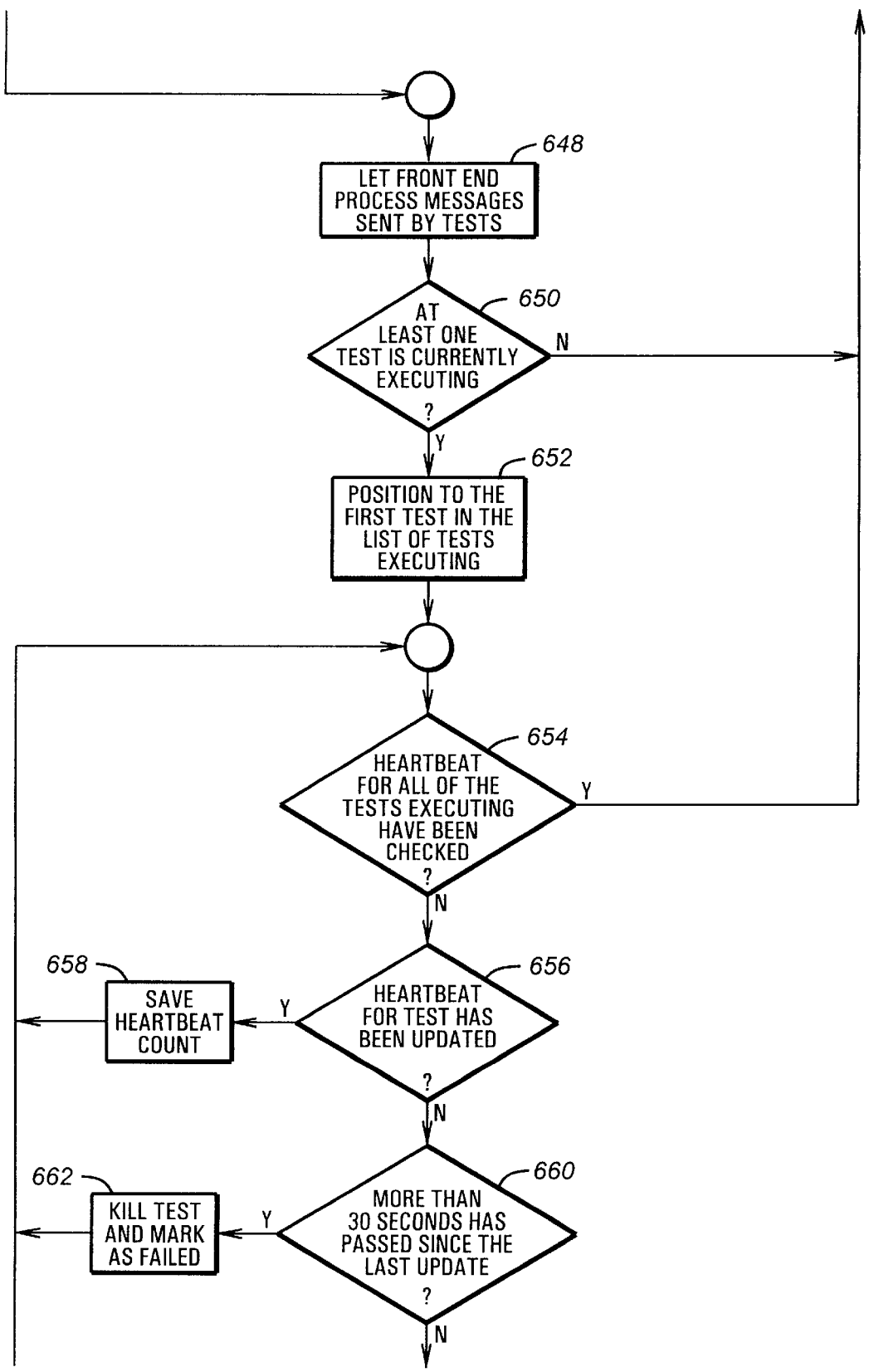
Figure 6E:
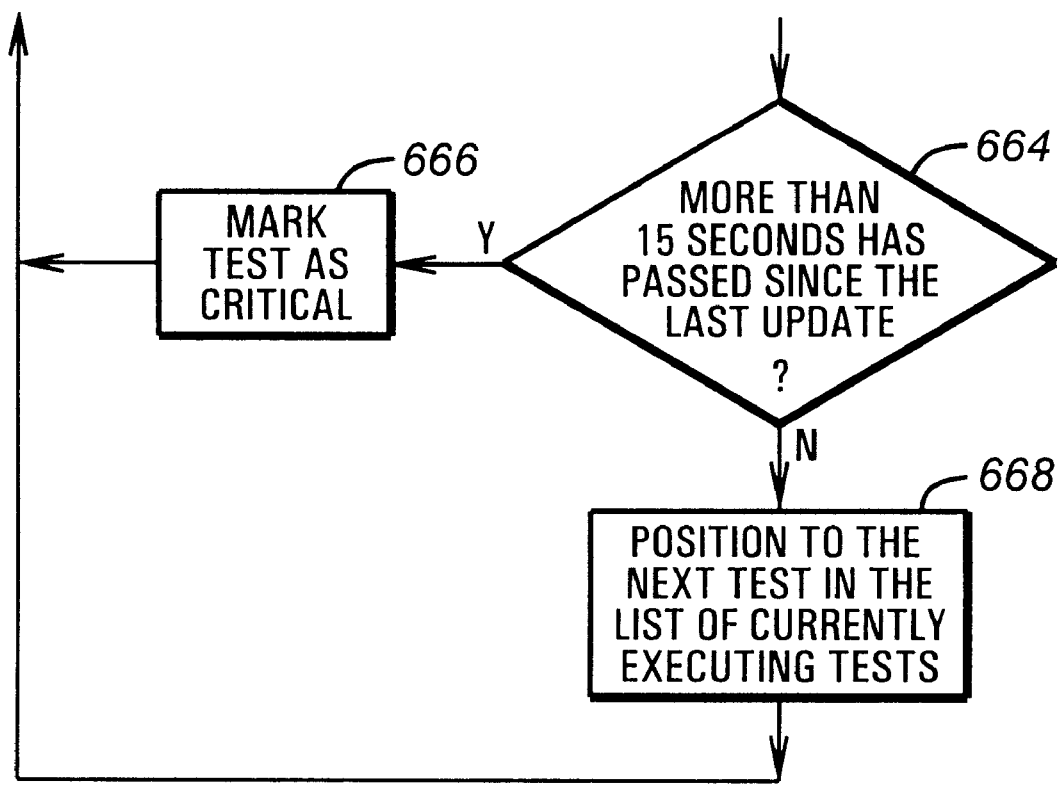

Now referring to FIGS. 5A–C, there is illustrated a flow diagram of the diagnostic application 150. It is understood that the precise order of events in a multi-tasking, or event oriented system is difficult to represent in a sequential flow diagram. However, the flow diagram is an accurate representation of a typical order of events.

The diagnostic application 150 is started when the front end module 210 is launched. At a step 500, the front end 210 determines whether another instance of the diagnostic application 150 is running. If so, the process continues to a step 534 where the currently running diagnostic application 150 is brought to the foreground (in focus). From step 534, the diagnostic application 150 exits. If another instance is not running, the process continues to a step 502 where the front end 210 loads and initializes various files, DLLs and VxDs.

At step 502, the remaining main components 208 and utility components 204 are loaded and initialized. Depending upon the operating system, the VxD interface module 280 and one of the remaining VxD components 206 are loaded. At a step 504, the front end 210 initialize a log file for storing information, such as devices identified, DLs loaded and tests completed. At a step 506, the front end 210 searches for and loads the diagnostic library components 202 via a windows LoadLibrary command. As the DLs are loaded, the front end 210 gathers their entry points by call the windows GetProcAddress command.

At a step 508, the front end 210 determines whether the module initialization and DL loading has been successful. If not, the process branches to step 532, where an error message is reported to the user and logged in the log file. From step 532, the process branches ahead to step 526, discussed below. If successful, the process continues to a step 510 where the main graphical user interface (GUI) is created containing menus and a speed bar.

At a step 512, the front end 210 performs the initialization and ID phases 302 and 304. Each DL loaded receives a DL_INITIALIZE from the front end 210 to cause the DL to initialize itself, which includes allocating resources and checking compatibility with the front end 210. After the DLs have been initialized, the front end 210 issues a DL_ID command to each DL that is loaded causing the DL to identify all devices and tests for which it is responsible, as described above. The device information is registered into the data engine 214 for subsequent display when the user desires information about the computer system C. All device, test and parameter information is registered with the test engine for performing the diagnostic tests.

The process continues to a step 514 where the front end 210 determines if a test sequence has already been defined in a test definition file (TDF) 400a. If so, processing branches ahead to step 522. If not so, processing continues to a step 516 where the front end 210 allows the user to select and modify tests 408b and test parameters 410b for located devices 406b.

From step 516, the process continues to step 518 where the user is queried whether to exit the diagnostic application 150. If so, processing branches ahead to step 526, discussed below. If not so, processing continues to a step 520 where the user is requested whether to begin testing. If "no" is chosen, the process branches back to step 516 to allow the user to make further modifications to the tests 408b and test parameters 410b. If "yes" is chosen, the process continues to step 522 where the front end 210 requests the test dispatcher 216 to launch the tests.

During this time, the front end 210 processes messages received from the error handler 218 and displays test status received from the test dispatcher 216. If errors are encountered, the front end 210 queries the recommended action module 220 for alternatives to provide to the user. The test dispatcher 216 also registers a heartbeat function with Windows so that a periodic check can be performed on the status of the DLs 234–268.

The heartbeat function periodically calls the test dispatcher 216 and the executing DLs 234–268. When the test dispatcher 210 is called by the heartbeat function, the HeartBeatCount parameter is incremented. If the currently executing DLs 234–268 receive the heartbeat call, a count in a private memory area of the DL is incremented. This count in the private memory area is available to the test dispatcher 210 via the ThreadDataBlock handle.

At a step 524, the front end 210 determines if the testing is complete. If not so, the process continues with step 522.

If complete, the process continues to step 526 where the front end 210 uninitializes and unloads the DLs loaded in step 506. At step 528, the front end 210 closes the log file. At step 530, the front end uninitializes and unloads the message file, static DLLs and VxDs loaded. This frees system resources for other applications to use, since the diagnostic application is finished running.

Now referring to FIGS. 6A–E, there is illustrated a flow diagram of the test dispatcher 216. The test dispatcher 216 is called by the front engine 210 at step 522 to control the number of active test threads as well as monitor the progress of tests and report the status to the user.

At a step 600 the test dispatcher 216 is initialized by the front end 210. At a step 602 a status screen is initialized and displayed. At a step 604 the test dispatcher 216 copies a list of tests to execute from the test engine 226 to the test dispatcher 216. The test list is comprised of one or more records, with each record corresponding to a test. At a step 606, the test dispatcher 216 dumps a copy of the list of tests to a log file.

At steps 608, 610, 612 and 614, the test dispatcher 216 determines whether it can continue processing or should return to the calling program (front end 210). The first pass through these steps is not as important as subsequent passes. At step 608, the test dispatcher 216 determines if the specified elapsed run time according to the global parameters 402a or 402b has been exceeded. If so, control is returned to the front end 210. If not so, the process continues to a stip 610 where the test dispatcher 216 determines if all of the tests have been executed. If so, then control is returned to the front end 210. If not so, then the process continues to a step 612 where the test dispatcher 216 determines if the user has aborted the testing. If aborted, control returns to the front end 210. If not so, then processing continues to a step 614 where the test dispatcher 216 determines if an error has occurred and the diagnostic application 150 is configured to stop on the occurrence of the first error. if true, then control is returned to the front end 210. If not true, then processing continues to a step 616 where the test dispatcher 216 determines if the maximum number of tests are already executing. By default, a maximum of four tests can be running. If so, then processing branches ahead to step 648, discussed below. If not so, then processing continues to a step 618 where the test dispatcher 216 determines whether a single threaded test is already executing. If so, then multiple tests cannot be executed and control branches ahead to step 648. If a single threaded test is not executing, then processing continues to step 620. Therefore, one can see that prior to the launching of the first test, the results at steps 608–618 will be negative causing the process to proceed straight to step 620. Alternatively, these steps could be skipped on a first pass.

At step 620, the test dispatcher 216 selects the first test in the list of tests. At step 622 the test dispatcher 216 determines if a test was launched or if the selected test is at the end of the lists of tests. If so, then processing branches ahead to step 648, discussed below. If not so, then processing continues to 624 where the test dispatcher 216 interrogates the selected test to retrieve parameter information. At step 626 the test dispatcher 216 determines if the currently selected test has executed or is currently executing. If so, then processing branches ahead to a step 646 where the test dispatcher selects the next test and returns to step 622. If not so, then processing continues to step 628.

At step 628, the test dispatcher 216 determines if the selected test is a single threaded test. This is determined by examining the MultiThreadTest parameter of the test dispatcher data structure, as shown in Table 2. A single threaded test must not be run concurrently with any other tests. If the selected test is not a single threaded test, then processing branches ahead to step 632, discussed below. If the selected test is single threaded, then processing continues to step 630 where the test dispatcher determines if there are any currently executing tests. This is determined by querying the list of currently executing tests. If a test is currently executing, then processing branches ahead to step 646. If a test is not currently executing, then processing continues to step 632 where the test dispatcher determines if a test is already executing on this particular device 406a or 406b. If so, then processing branches ahead to step 646. For example, a sequential seek test on the hard disk 124 could not be performed concurrently with a random seek test on the same hard disk 124. If a test is not currently executing on this particular device 406a or 405b, then processing continues to step 634 where the test dispatcher 216 determines if the selected test can be concurrently executed with the currently executing test(s).

Certain devices cannot be (or should not be) executed concurrently with other categories of devices. For example, the CD-ROM 126 should not be tested concurrently with the sound device 134. This is because the CD-ROM 126 test activates the sound device 134. Conversely, the sound device 134 test causes the CD-ROM to be activated. Therefore, to avoid erroneous test results, these tests should not be performed concurrently. A list of categories is illustrated in Table 4. To make this determination, the test dispatcher 216 examines the CategoryMask field and MultiTaskMask field. The CategoryMask field is a bitwise field representing which category the test belongs to. The MultiTaskMask field denotes which categories, if any, the test cannot execute concurrently with. If at step 634 it is determined that the selected test cannot be executed concurrently, then processing branches ahead to step 646. If the test can be concurrently executed with the currently executing tests, then processing continues to a step 636.

At step 636, the test dispatcher 216 determines if the selected test needs to display a status window while executing. If so, then processing continues to step 644 where the test dispatcher 216 determines if a currently executing test already controls the status window. If so, then processing continues to step 646. This is done to avoid providing the user with too many status windows. If the responses to steps 636 and 644 are negative, then processing continues to step 638 where the test dispatcher 216 makes modifications to the test parameters 410a, if read from a TDF 400a, and dumps the individual test record to the log file, at step 640.

At a step 642, the test dispatcher 216 causes the selected test to be launched. To launch the test, the test dispatcher 216 issues a launch test command to the DL to which the test belongs. Once the DL receives the launch test command, it determines which test 408a or 408b and for which device 406a or 406b it needs to run. Once determined, the DL starts the thread for the test 408a or 408b to run in and immediately returns control to the test dispatcher 216. Once launched, the test dispatcher 216 marks the test as a currently executing test, which allows a list of currently executing tests to be developed. Periodically, after a certain percentage of the test has completed, the DLs 234-268 increment their heartbeat count. The DLs 234-268 store the heart beat count in a memory location pointed to by the ThreadDataBlock field. If the DL is not operating correctly, it will miss some of the heart beats. Processing continues from step 642 back to step 622.

At step 648, the test dispatcher 216 permits the front end 210 to process messages received by the tests executing. It is during this phase that the front end 210 sits idle for a short period of time while testing continues. At step 650, the test dispatcher 216 determines if there is at least one test currently executing. If not so, then processing branches back to step 608. If so, then processing continues to a step 652 where the test dispatcher 216 selects a first test from a list of executing tests. At a step 654, the test dispatcher 216 determines if the heartbeat for all of the tests executing has been checked. If so, processing branches back to step 608. If not so, processing continues to a step 656 where the test dispatcher 216 determines if the heartbeat for the selected executing test has been updated.

The heartbeat count is checked by comparing the test dispatcher's 216 heartbeat count to the DL's 234-268 heartbeat count. The test dispatcher 216 stores the heartbeat count in the HeartBeatCount field. The DL's 234-268 store the heartbeat count in a memory location of the DL. The DL's memory location is accessible by the test dispatcher 216 via the ThreadDataBlock field. If the count of the DL has been updated, processing continues to step 658 where the heartbeat count is saved in the HeartBeatCount field. From step 658 processing continues back to step 654.

If at step 656 it is determined that the heartbeat has not been updated, then processing continues to step 660 where the test dispatcher 216 determines if more than 5 heartbeats (30 seconds) have passed since the last heartbeat update to the selected executing test. If so, then processing continues to step 662 where the selected executing test is killed and marked as failed. From step 662 processing continues back to step 654. If at step 660 it is determined that 30 seconds have not passed, then processing continues to step 664 where the test dispatcher 216 determines if more than 2 counts (15 seconds) have passed since the last update. If so, processing continues to step 666 where the test is marked as critical. From step 666 processing continues back to step 654. If at step 664 it is determined that 15 seconds have not passed, then the test dispatcher 216 marks the test as stable and selects the next test in the list of currently executing tests. From step 668 processing continues back to step 654 to continue checking the heartbeat until all of the executing tests have been checked.

Therefore, the test dispatcher 216 efficiently executes a plurality of highly compartmentalized DLs 234-268 according to their individual and collective multi-tasking capabilities. New DLs can easily be added to the diagnostic application 150 by simply writing a new DL according the same API used by other DLs. Each DL registers with the test dispatcher 216 so that the test dispatcher can control the execution of the DLs.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

TABLE 4

| Categories | Categories Devices |
| --- | --- |
| System | CPU, bridges, etc. |
| Asset Control | serial numbers, etc. |
| Input devices | keyboard, mouse, joystick, etc. |
| Communications | serial ports, parallel ports, modems, USB, etc. |

TABLE 4-continued

Categories

| Categories | Devices |
|---|---|
| Storage | hard disk, floppy disk, CD-ROM, tape, etc. |
| Video | video controller, frame buffer, monitor |
| Memory | memory |
| Multimedia | sound devices, CD-ROM, speakers, microphones, TV, etc. |
| User preferences | security settings, power-on password, configuration lock, power mgmnt settings |
| Operating System | Windows, Windows NT, OS/2, etc. |
| Windows | WIN.INI, SYSTEM.INI, etc. |
| System Architecture | PCI, EISA, ISA, etc. |
| System Resources | list of IRQs, Addresses and DMA channel allocations |
| Health Logs | Systems division logs |
| Miscellaneous | SIT, CMOS, BDA (BIOS Data Area), Cq loaded s/w |

What is claimed is:

1. A method of testing a peripheral device in a computer system, the method comprising the steps of:

(a) providing a number of independent test modules as independent library modules along with associated peripheral devices, tests and parameters;

(b) loading and initializing the test modules, each test module identifying to a test front end program the peripheral devices for which it is responsible and a number of tests available to perform, each test having a number of parameters;

(c) the test front end program permitting selection of some subset of the test modules for execution;

(d) providing a list of the subset of the test modules and the associated peripheral devices, tests and parameters to a test dispatcher by each test module; and (e) dispatching the test modules for execution in accordance with the list of peripheral devices, tests and parameters.

2. The method of claim 1, wherein the peripheral device is a network interface controller.

3. The method of claim 1, wherein the peripheral device is a multifunction I/O peripheral.

4. The method of claim 3, wherein the multifunction I/O peripheral includes multiple serial ports, a parallel port and a floppy disk controller.

5. The method of claim 1, wherein the peripheral device is a video controller.

6. The method of claim 1, wherein the peripheral device is a storage device.

7. The method of claim 6, wherein the storage device is a hard disk drive and wherein the tests that can be performed on the hard disk drive include a sequential seek test, a random seek test, and a converging seek test.

8. A computer system, comprising:

a processor;

a video display system coupled to said processor; and a plurality of peripheral devices coupled to said processor, wherein the processor is capable of performing the following steps:

(a) providing a number of independent test modules for the peripheral devices as independent library modules along with associated tests and parameters;

(b) loading and initializing the test modules, each test module identifying to a test front end program the peripheral device for which it is responsible and a number of tests available to perform, each test having a number of parameters;

(c) the test front end program permitting selection of some subset of the test modules for execution;

(d) providing a list of the subset of the test modules and the associated peripheral devices, tests and parameters to a test dispatcher by each test module; and (e) dispatching the test modules for execution in accordance with the list of peripheral devices, tests and parameters, the executed test modules testing their associated peripheral devices.

9. The computer system of claim 8, wherein one of the peripheral devices is a network interface controller.

10. The computer system of claim 8, wherein one of the peripheral devices is a multifunction I/O peripheral.

11. The computer system of claim 10, wherein the multifunction I/O peripheral includes multiple serial ports, a parallel port and a floppy disk controller.

12. The computer system of claim 8, wherein one of the peripheral devices is a keyboard controller.

13. The computer system of claim 8, wherein one of the peripheral devices is a storage device.

14. The computer system of claim 13, wherein the storage device is a hard disk drive and wherein the tests that can be performed on the hard disk drive include a sequential seek test, a random seek test, and a converging seek test.

15. A computer system, comprising:

a processor;

a video display system coupled to said processor;

a hard disk drive system coupled to said processor; and a plurality of peripheral devices coupled to said processor, wherein the processor is capable of performing the following steps:

(a) providing a number of independent test modules for the peripheral devices as independent library modules along with associated tests and parameters;

(b) loading and initializing the test modules, each test module identifying to a test front end program the peripheral device for which it is responsible and a number of tests available to perform, each test having a number of parameters;

(c) the test front end program permitting selection of some subset of the test modules for execution;

(d) providing a list of the subset of the test modules and the associated peripheral devices, tests and parameters to a test dispatcher by each test module; and (e) dispatching the test modules for execution in accordance with the list of peripheral devices, tests and parameters, the executed test modules testing their associated peripheral devices.

16. The computer system of claim 15, wherein one of the peripheral device is a network interface controller.

17. The computer system of claim 15, wherein one of the peripheral devices is a multifunction I/O peripheral.

18. The computer system of claim 17, wherein the multifunction I/O peripheral includes multiple serial ports, a parallel port and a floppy disk controller.

19. The computer system of claim 15, wherein one of the peripheral devices is a keyboard controller.

20. The computer system of claim 15, wherein the test modules are stored on said hard disk drive system.

* * * * *